United States Patent [19]
Lai et al.

[11] Patent Number: 5,886,586
[45] Date of Patent: Mar. 23, 1999

[54] GENERAL CONSTANT FREQUENCY PULSE-WIDTH MODULATORS

[75] Inventors: Zheren Lai; Keyue M. Smedley, both of Irvine, Calif.

[73] Assignee: The Regents of the University of California, Oakland, Calif.

[21] Appl. No.: 924,528

[22] Filed: Sep. 5, 1997

Related U.S. Application Data

[60] Provisional application No. 60/025,886, Sep. 6, 1996.

[51] Int. Cl.$^6$ ...................................................... H03K 7/08
[52] U.S. Cl. .......................... 332/109; 327/176; 375/238
[58] Field of Search ........... 332/109–111; 327/172–177; 375/238

[56] References Cited

U.S. PATENT DOCUMENTS 5,506,533  4/1996  Wu ...................................... 327/172 X

OTHER PUBLICATIONS

K.M. Smedley and S. Cuk, "One–Cycle Control of Switching Converters," in Institute of Electrical & Electronics Engineers Power Electronics Specialists Conference proceedings, pp. 888–896, Apr. 1991.

D.M. Sable, B.H. Cho, and R.B. Ridley, "Use of Leading–Edge Modulation to Transform Boost and Flyback Converters into Minimum Phase Zero Systems," Institute of Electrical & Electronics Engineers Trans. on Power Electronics, vol. 6, No. 4, pp. 704–711, Oct 1991.

K.M. Smedley, "Integrators in pulse width modulation," Institute of Electrical & Electronics Engineers Power Electronics Specialists Conference proceedings, pp. 773–781, Jul. 1996.

J. Jin, G. Joos, M. Pande, P.D. Ziogas, "Feedforward Techniques Using Voltage Integral Duty–Cycle Controls," Institute of Electrical & Electronics Engineers Power Electronics Specialists Conference proceedings, pp. 371–377, Mar. 1992.

L. Calderone, L. Pinola, V. Varoli, "Optimal feedforward compensation for PWM DC/DC converters with linear and quadratic conversion ratio," Institute of Electrical & Electronics Engineers Trans. on Power Electronics, vol. 7, No. 2, pp. 349–355, Apr. 1992.

B. Arbetter and D. Maksimovic, "Feed–forward Pulse–width Modulators For Switching Power Converters," Institute of Electrical & Electronics Engineers Power Electronics Specialists Conference proceedings, pp. 601–607, Jun. 1995.

R.D. Middlebrook and S.Cuk, "A general unified approach to modeling switching–converter power stages," Institute of Electrical & Electronics Engineers Power Electronics Specialists Conference proceedings, pp. 73–89, Jun. 1976.

R.D. Middlebrook, "Predicting Modulator Phase lag in PWM converter feedback loops," Proceedings of of Powercon 8, Dallas, TX, pp. 245–250, Apr. 1981.

D. Gyma, "A novel control method to minimize distortion in ac converters," Institute of Electrical & Electronics Engineers Applied Power Electronics Conference proceedings, pp. 941–946, May 1994.

J. Sebastian, M. Jaureguizar, J. Uceda, "An overview of power factor correction in single–phase off–line power supply systems," Institute of Electrical & Electronics Engineers International Conference on Industrial Electronics, Control and Instrumentations (IECON'94) proceedings, pp. 1688–1693, Mar. 1994.

(List continued on next page.)

*Primary Examiner*—David Mis
*Attorney, Agent, or Firm*—John P. O'Banion

[57] ABSTRACT

A constant frequency pulse-width modulator that realizes various control schemes with trailing-edge, leading-edge or double-edge modulation is disclosed. This PWM modulator, which employs one or more integrator with reset stages, can be generally applied to implement feed-forward control of a family of converters, current mode control with linear or non linear compensating slope, and a family of unity-power-factor rectifiers at continuous or discontinuous conduction mode.

30 Claims, 30 Drawing Sheets

OTHER PUBLICATIONS

D. Maksimonvic, Y. Jang, and R. Erickson, "Nonlinear–carrier control for high power factor boost rectifiers," Institute of Electrical and Electronic Engineers Applied Power Electronics Conference proceedings, pp. 635–641, Mar. 1995.

R. Zane and D. Maksimovic, "Nonlinear–carrier control for high–power–factor rectifiers based on flyback, Cuk or SEPIC converters," Institute of Electrical and Electronics Engineers Applied Power Electronics Conference proceedings, pp. 814–820, Jul. 1996.

Z. Lai and K.M. Smedley, "Time Quantity One–Cycle Control for Power Factor Correctors," Institue of Electrical and Electronics Engineers Applied Power Electronics Conference proceedings, pp. 821–827, Jul. 1996.

D. Mitchell, "Pulsewidth Modulator Phase Shift," Institute of Electrical & Electronics Engineers Transactions on Aerospace and Electronic Systems, vol. AES–16, No. 3, pp. 272–277, May 1980.

Ch2: 1 A/div          Horizontal: 5.0ms/div

Ch2: 0.5 A/div          Horizontal: 5ms/div

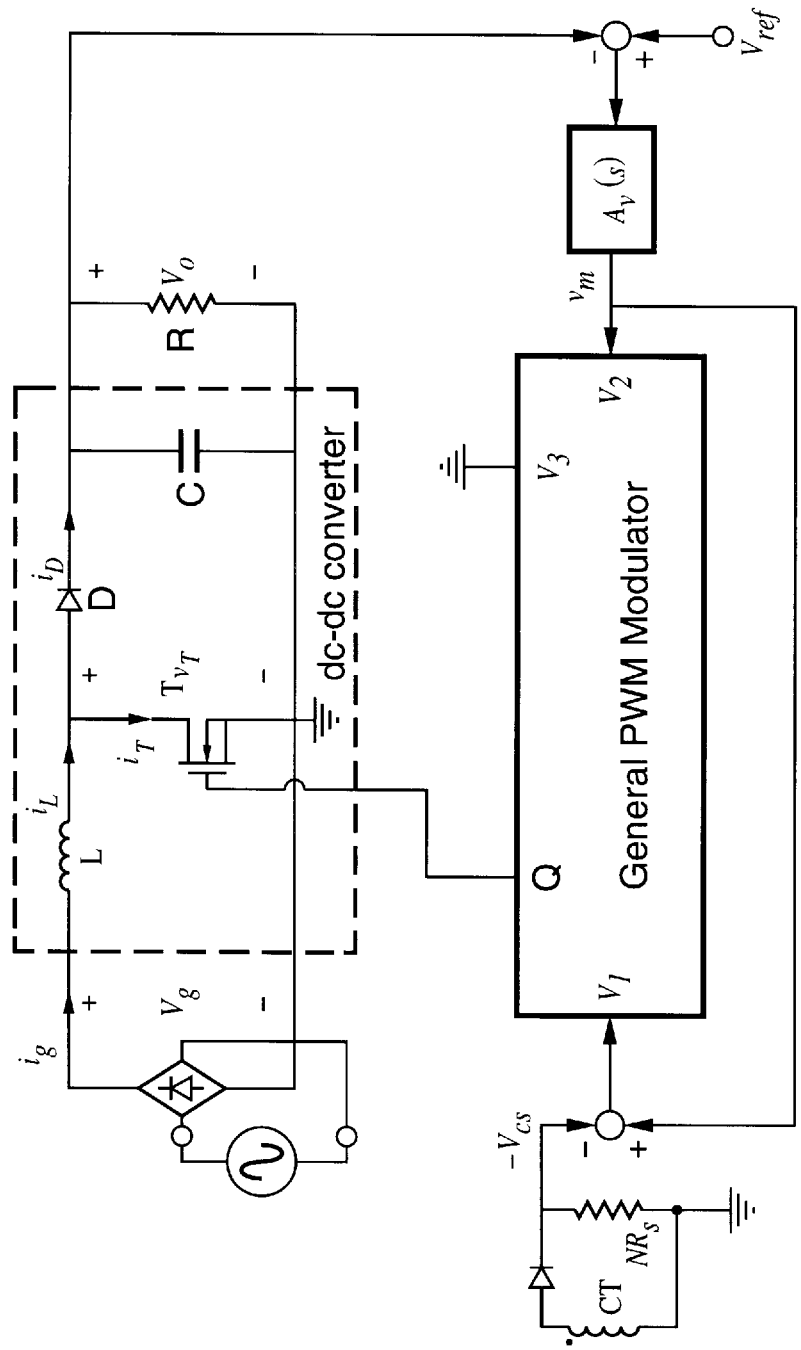
FIG. −22 (b)

CH1: 0.5/div  CH3: 5A/div     TIME: 5ms/div

CH1: 0.5/div  CH3: 2A/div     TIME: 5ms/div

GENERAL CONSTANT FREQUENCY PULSE-WIDTH MODULATORS

CROSS-REFERENCE TO RELATED APPLICATIONS

This application claims priority from U.S. provisional application Ser. No. 60/025,886 filed on Sep. 6, 1996, which is incorporated herein by reference.

STATEMENT REGARDING FEDERALLY SPONSORED RESEARCH OR DEVELOPMENT

Not Applicable

REFERENCE TO A MICROFICHE APPENDIX

Not Applicable

REFERENCED PUBLICATIONS

The following publications are incorporated herein by reference, some of which are referenced throughout by their reference number indicated in [brackets]:

[1] K. M. Smedley and S.Cuk, "One-Cycle Control of Switching Converters," in IEEE PESC'91.

[2] D. M. Sable, B. H. Cho, and R. B. Ridley, "Use of Leading-Edge Modulation to Transform Boost and Flyback Converters into Minimum Phase Zero Systems," IEEE Trans. on Power Electronics, Vol. 6, No. 4, Oct 1991.

[3] K. M. Smedley, "Integrators in pulse width modulation," PESC'96.

[4] G. Levin, "Secondary side post regulator for switching power supplies with multiple outputs," CS-5101 Application note, Cherry Semiconductor Corporation, 1996.

[5] J. Jin, G. Joos, M. Pande, P. D. Ziogas, "Feedforward Techniques Using Voltage Integral Duty-Cycle Control," PESC'92.

[6] L. Calderone, L. Pinola, V. Varoli, "Optimal feedforward compensation for PWM DC/DC converters with "linear" and "quadratic" conversion ratio," IEEE Trans. on Power Electronics, Vol. 7, No. 2, April 1992.

[7] B. Arbetter and D. Maksimovic, "Feed-forward Pulsewidth Modulators For Switching Power Converters," PESC'95.

[8] R. D. Middlebrook and S. Cuk, "A general unified approach to modeling switching-converter power stages," PESC'76.

[9] R. D. Middlebrook, "Predicting Modulator Phase lag in PWM converter feedback loops," Proceeding of Powercon 8, Dallas, Tex., 1981.

[10] C. W. Deisch, "Simple switching control method changes power converter into a current source," IEEE PESC'78.

[11] A. Capel, G. Ferrante, D. O'Sullivan, and A. Weinberg, "Application of the injected current model for the dynamics of switching regulators with the new concept of LC3 modulator," IEEE PESC'78.

[12] D. Gyma, "A novel control method to minimize distortion in ac converters," IEEE APEC proceedings, 1994.

[13] F. D. Tan, "Current-Loop Gain with a Nonlinear Compensating Ramp," PESC'96.

[14] J. Sebastian, M. Jaureguizar, J. Uceda, "An overview of power factor correction in single-phase off-line power supply systems," IECON'94.

[15] D. Maksimonvic, Y. Jang, and R. Erickson, "Nonlinear-carrier control for high power factor boost rectifiers," APEC'95.

[16] R. Zane and D. Maksimovic, "Nonlinear-carrier control for high-power-factor rectifiers based on flyback, Cuk or SEPIC converters," APEC'96.

[17] Z. Lai and K. M. Smedley, "Time Quantity One-Cycle Control for Power Factor Correctors," APEC'96.

[18] J. G. Kassakian, M. F. Schlecht, and G. C. Verghese, Principles of Power Electronics, Addison-Wesley publishing Company, 1991.

[19] Jeffrey Hwang, Alland Chee, and Wing-Hung Ki, "New >universal control methods for power factor correction and DC to DC converter applications," IEEE APEC'97.

[20] J. Gegner and C. Q. Lee, "Linear peak current mode control: a simple active power factor correction control technique for continuous conduction mode," IEEE PESC'96.

BACKGROUND OF THE INVENTION

1. Field of the Invention

The present invention relates generally to methods of providing modulation signals to electrical circuits and, more particularly, to a method and apparatus for providing a generalizable pulse width modulation signal using either trailing edge or leading edge modulation.

2. Description of the Background Art

Switching converters are commonly used to provide DC to DC, DC to AC, AC to DC and AC to AC conversion of electrical waveforms. These converters are often categorized by applicable circuit configuration and/or capabilities, and include buck converters (where the load voltage is less than the source voltage), boost converters (where the load voltage is greater than the source voltage), buck-boost converters (which are capable of either), Cuk converters, Watkins-Johnson converters, and A, B, and C quadratic converters. All of these converters rely on switching control and, furthermore, the performance of electrical circuits, including converters, can be improved by closed loop control of a control variable selected by the designer.

Constant frequency pulse-width modulation (PWM) is a well-known method to control switching converters. Generally speaking, PWM allows a switching converter variable to be controlled by modulating the width of a control pulse in each switching cycle. Generally, output-voltage, output-current, input-current, or any other variable or combination of variables are eligible as controlled-variables for a specific control task.

Many methods are available to modulate the pulse-width including, but not limited to, comparing a modulation reference to a constant frequency linear or non-linear carrier, by current-mode control, or by one-cycle control as described in reference [1]. For each method, PWM may be performed on trailing-edge, leading-edge, or both edges of the output-pulse. These are referred to as trailing-edge, leading-edge, and double-edge modulation, respectively. These three modulation types differ little from each other at low frequency from a dynamics standpoint. However, it has been observed that their characteristics at high frequency may be distinct, as described in references [2] and [3].

Most commercially available PWM control chips employ trailing-edge modulation but, for some applications, leading-edge modulation is more desirable, such as the secondary side PWM control chip described in reference [4]. Further, leading-edge modulation can sometimes result in simpler control circuitry.

However, while PWM control is often relatively simple in theory, it is not in application. While modulation equations describing the required mathematical relationship between the controlled variable and the modulation equation may be expressed in closed form, implementing these mathematical relationships in electrical circuitry to effect the desired control scheme is often a complicated, time-consuming, and expensive process, requiring extensive analysis, special electrical components, or additional circuitry.

Therefore, there is a need for a pulse-width modulator which allows the system and circuit designer to implement a wide variety of constant-frequency control schemes without the need for special circuit components or specially designed circuits requiring extensive analysis and design. The present invention meets this need, as well as others, with a generalized pulse-width modulator that allows modulation expressions to be easily and directly implemented in electronic hardware.

BRIEF SUMMARY OF THE INVENTION

The present invention generally comprises a generalized constant-frequency pulse-width modulator. In accordance with an aspect of the invention, the modulator comprises a constant clock, a R-S flip-flop, a comparator, N number (where N is an integer such as 1, 2, 3, ) stages of integrator with reset, gain blocks, and summers. The modulator can realize N-th order polynomial functions, realize leading edge and trailing edge PWM modulation for controlling switching converters. In accordance with another aspect of the invention, the modulator includes two-integrator stages and can be implemented in two forms of integrated circuits. These configurations are universal PWM modulators that can be applied to many PWM controls. In accordance with a further aspect of the invention, we describe a general mathematical approach to utilize the general modulator. In accordance with still another aspect of the invention, we apply the modulator to power factor controllers (PFC) for continuous conduction mode (CCM) power topologies. We also describe control methods that can be used to create a family of controllers using the modulator.

An object of the invention is to provide a pulse-width modulator that can be used in numerous control applications including, but not limited to, the basic voltage-mode (also called duty-ratio programmed) PWM control, linear or non-linear compensating-slope current-mode control, one-cycle control, feed-forward control, discontinuous or continuous conduction mode power-factor-correction control.

Another object of the invention is to provide a pulse-width modulator that can perform trailing-edge or leading-edge modulation, and is easily abstracted to form a general double-edge modulator from the leading and trailing-edge modulators. In most applications, these three modulation types are considered equivalent unless requirements such as in references [2], [3] or [4] are desired. For applications where these three modulator types are equivalent, the simplicity of implementation may be used as a criteria to select either leading-edge or trailing-edge modulator.

Another object of the invention is to provide a generalized pulse-width modulation method which permits a wide variety of modulation variable relationships to be readily transformed from a mathematical expression to physical expression in the form of an electrical circuit.

Another object of the invention is to provide a family of feed-forward controllers for switching converters which are derived for either trailing-edge or leading-edge modulation. A small-signal dynamic model is also presented and verified by applying the model to a feed-forward PWM controlled buck converter.

Another object of the invention is to apply the generalized pulse-width modulator of the present invention to current-mode control of either linear or non-linear compensating-slope designs.

Another object of the invention is to apply the generalized pulse-width modulator of the present invention to a class of active power-factor-correction (PFC) controllers, resulting in a simple, high performance controller.

Another object of the invention is to apply the generalized pulse-width modulator of the present invention to effect a discontinuous conduction mode (CCM) power-factor controller.

Further objects and advantages of the invention will be brought out in the following portions of the specification, wherein the detailed description is for the purpose of fully disclosing preferred embodiments of the invention without placing limitations thereon.

BRIEF DESCRIPTION OF THE DRAWINGS

The invention will be more fully understood by reference to the following drawings which are for illustrative purposes only.

DETAILED DESCRIPTION OF THE INVENTION

Figure 1:
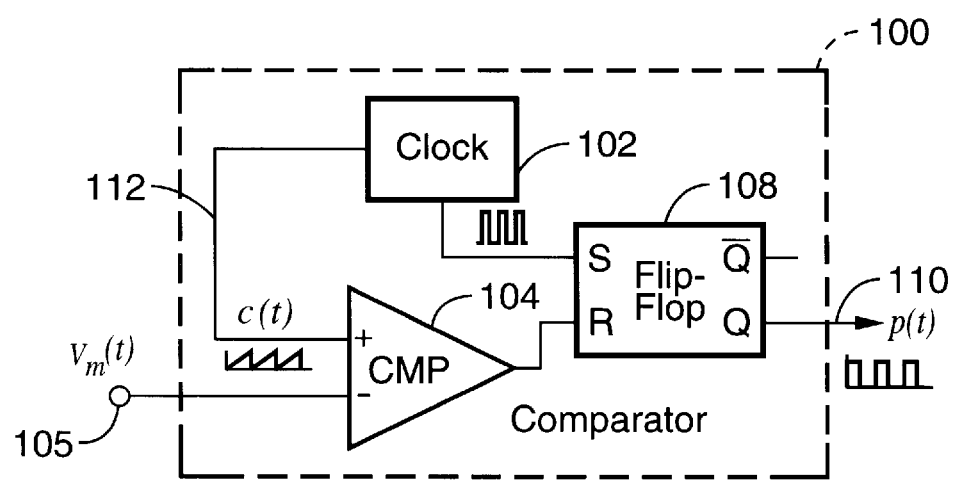
FIG. 1(a) provides a functional illustration of a constant frequency pulse width modulator.
FIG. 1(b) depicts modulation waveforms for the constant frequency pulse width modulator illustrated in FIG. 1(a).
FIG. 1(c) through 1(d) depict modulation waveforms for leading-edge and double-edge, respectively.
Figure 1:
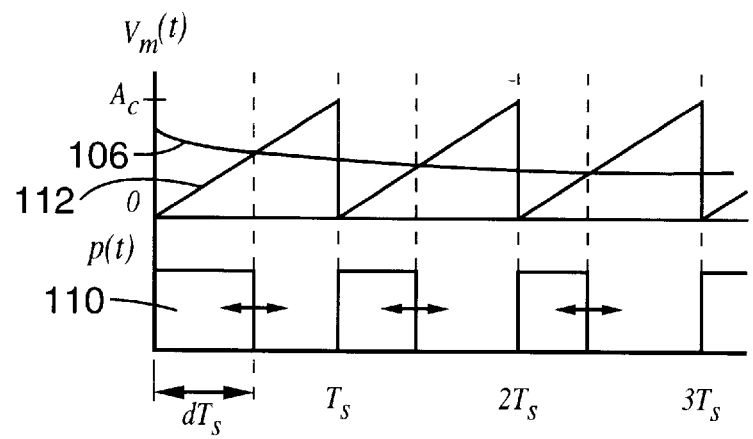
Figure 1:
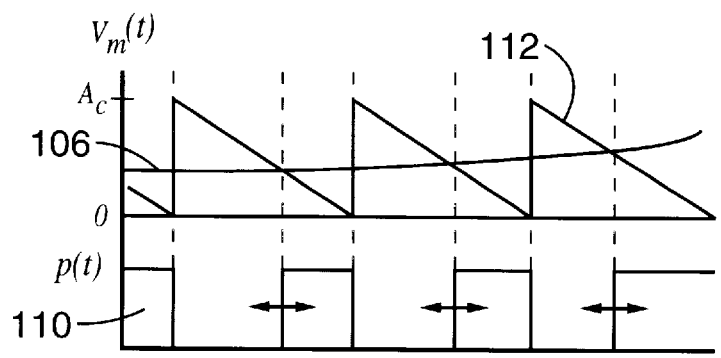
Figure 1:
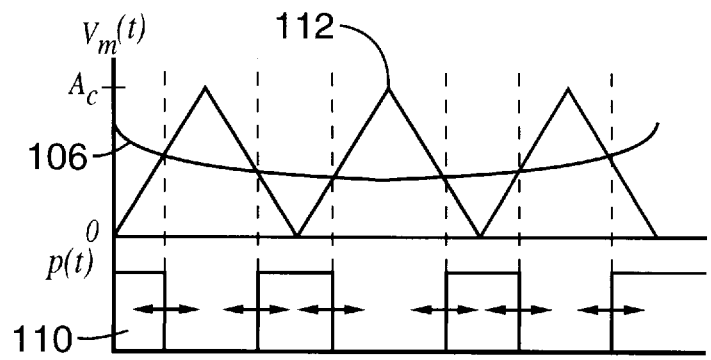
Figure 2:
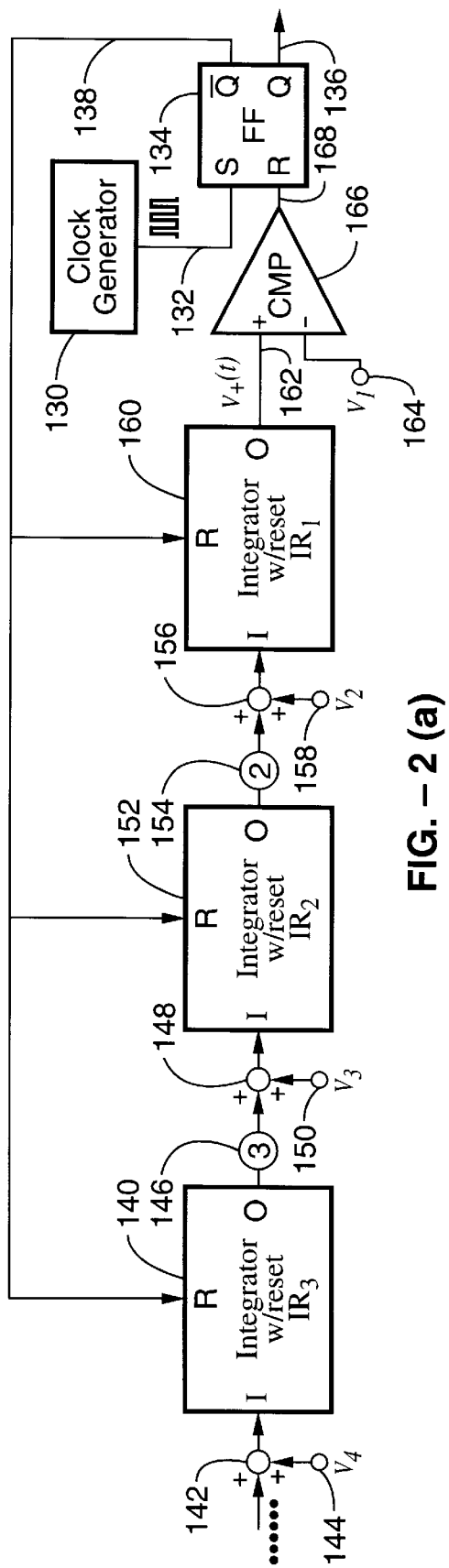
FIG. 2(a) is a diagram of a general modulator circuit in accordance with the present invention.
FIG. 2(b) is a plot of the operational waveforms of the general modulator circuit shown in FIG. 2(a).
Figure 2:
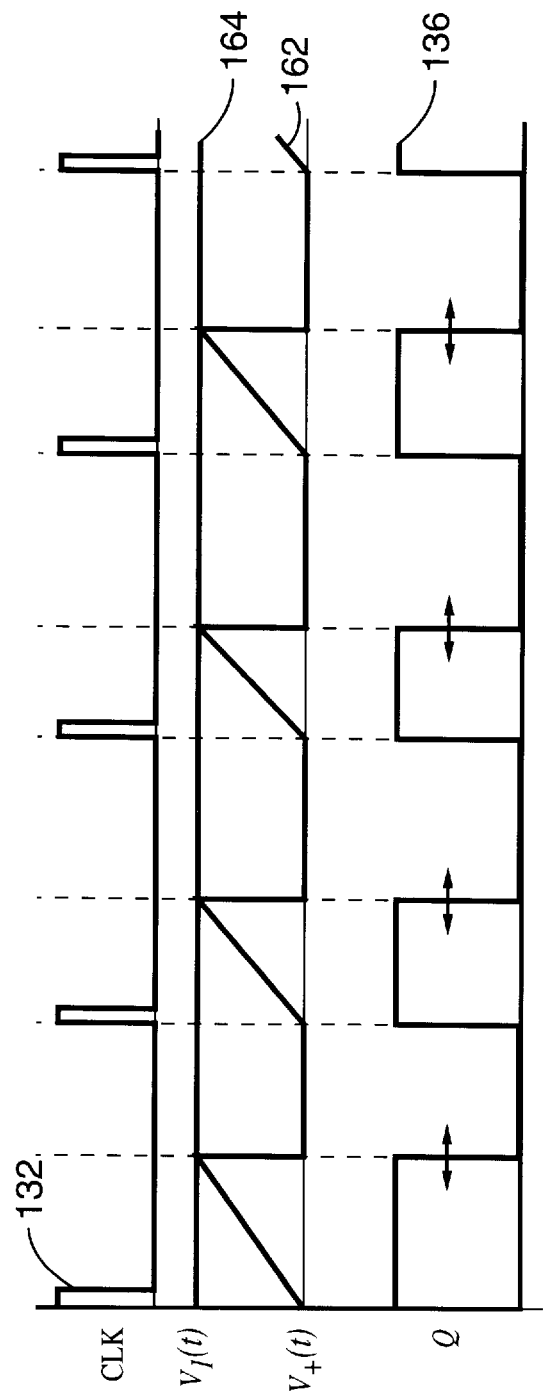
Figure 3:
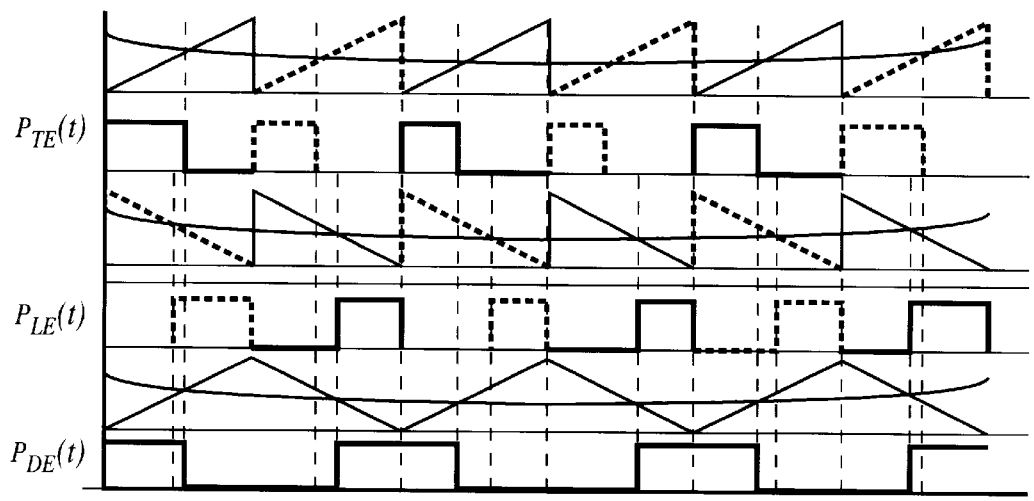
FIG. 3(a) is a diagram of the operational waveforms of the double-edge modulator of FIG. 3(b).
FIG. 3(b) is a diagram of an implementation of a double-edge modulator in accordance with the present invention.
Figure 3:
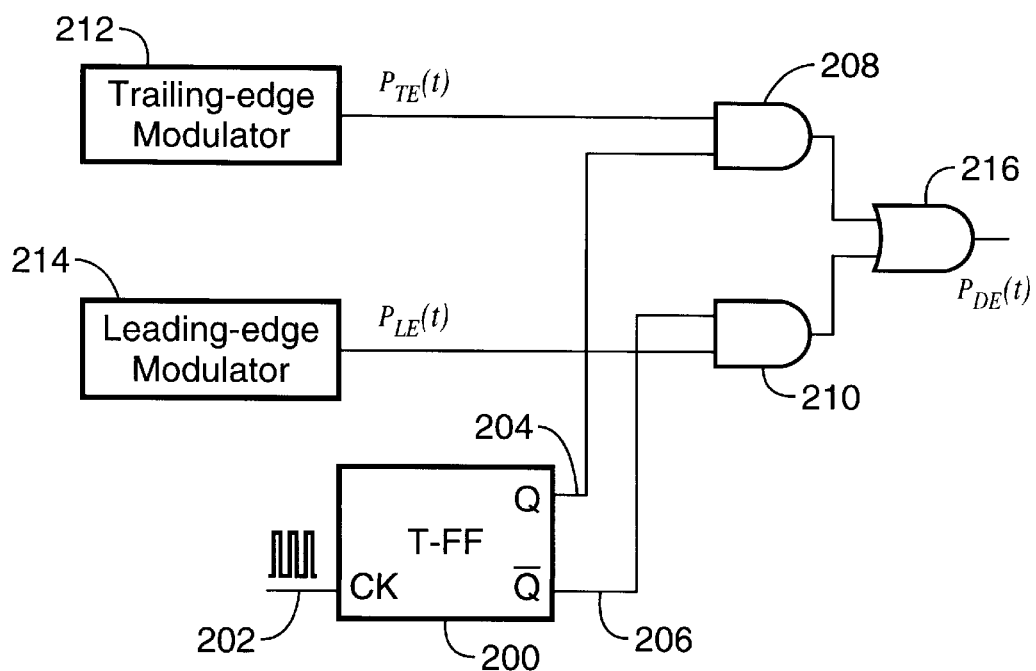

Referring more specifically to the drawings, for illustrative purposes, the present invention is described with reference to FIG. 1 through FIG. 24 where like reference numerals denote like elements. It will also be appreciated that the apparatus may vary as to configuration and as to details of the parts and that the method may vary as to the steps and their sequence without departing from the basic concepts as disclosed herein.

In the discussion below, the following notation conventions are used: Capital letters are used for quantities associated with steady-state unless indicated explicitly; lower case letters represent time-variant variables; a quantity in a pair of angular-brackets is the local-average of the quantity, i.e. the average in each switching cycle; and hatted quantities are of small-signal perturbation.

1. A General Constant Frequency PWM Modulator

Constant frequency PWM modulation is commonly implemented by comparing a modulation reference $v_m(t)$ to a constant frequency sawtooth or triangular carrier c(t), as shown in FIG. 1(a).

The constant frequency modulator 100 comprises a clock 102 which provides a constant frequency pulsed signal, which is provided to a flip-flop 108. In the illustrated embodiment, flip-flop 108 is a set-reset flip flop well known in the art, with a Q output and a Q bar output which is complementary to the Q output. Other flip-flop types may also be used in the constant frequency modulator 100.

The reset input to the flip flop 108 is coupled to the output of comparator 104, whose inputs are coupled to the clock 102 for a sawtooth or triangular carrier waveform 112 and to a modulation reference signal 106. The comparator 104 compares the sawtooth waveform with the modulation reference. When the modulation reference is greater than the carrier, the comparator 104 provides a signal to the reset input of the flip-flop 108, resetting the Q output to zero. At other times (when the modulation reference is less than the carrier) the comparator does not provide a signal to the flip-flop 108. Accordingly, the Q output of the flip-flop 108 depends on the set input, which is driven by the pulse from the clock 102.

For trailing-edge modulation waveforms shown in FIG. 11(b), the carrier c(t) in each cycle is $$c(t)=A_c(t/T_S)\ 0 \leq t \leq T_S, \tag{1}$$

where $A_c$ is the carrier amplitude and $T_S$ is the switching period. The output-pulse p(t) 110 is set to 1 at the beginning of a switching cycle and is reset to 0 when $$c(t)=v_m(t). \tag{2}$$

The duty-ratio d in a switching-cycle is defined as the ratio of the time-interval when p(t)=1 to the switching period $T_S$. The duty-ratio d is considered as the output of the modulator instead of the concrete waveform p(t) in later discussion since they are equivalent. In order for the duty-ratio to be controllable, $v_m(t)$ must satisfy $0 \leq v_m(t) \leq A_c$. FIG. 1(c) and FIG. 1(d) are waveforms for leading-edge and double-edge modulation respectively.

In most applications, the amplitude of the carrier is kept constant, thus the only control-input to the modulator is the modulation reference $v_m(t)$. The modulator output d satisfies modulation equation $$A_c d = v_m(t). \tag{3}$$

In some applications, the carrier amplitude is modulated, such as the feed-forward control of a buck converter [1,5-7]. The carrier amplitude is usually modulated by a signal whose frequency is well below the switching frequency. Under this situation, (3) is still valid except that the amplitude $A_c$ is now a time-dependent variable, hence, the modulator has control-inputs $v_m(t)$ and $A_c(t)$.

When the carrier amplitude is modulated, one more control dimension is added to the modulator. Furthermore, the shape of the carrier can also be controlled which results in even more control dimensions to the modulator. Various variables, such as the modulation reference, any sources-with-disturbance, and any feedback signals, can contribute to the shape of the carrier so as to participate in the decision-making of the optimal duty-ratio d for that switching cycle. In general, the modulation equation can be arranged in the form of $$v_1=(v_2 d+v_3 d^2+v_4 d^3+\dots) \tag{4}$$

where $v_1, v_2, \dots$ are control-inputs to the modulator and are linear combinations of those variables mentioned above. Normally $v_1, v_2, \dots$ are slow-varying signals compared to the switching frequency. The function of the modulator is to determine d for each switching cycle that satisfies (4).

A general constant frequency PWM modulator shown in FIG. 2(a) realizes the general modulation equation (4). This modulator comprises a constant-frequency-clock generator, an R-S flip-flop FF, a comparator CMP, N-stages of integrators-with-reset $IR_n$ where n=1, ..., N and N is an integer, N-1 stages of summers, N-1 constant gain blocks shown in circles, where 2, 3, ... represents constant gains of 2, 3, ... respectively. Note that the gain of the constant gain block at the output of a specific integrator $IR_n$ is n for n≧2 and $IR_1$ is the integrator having an output connected to comparator CMP. The integrator-with-reset performs conventional integration, unless the control-input R is at logical high state, during which the integrator is reset and the output O is at zero voltage. The integrators' time-constant $T_i$ is selected to equal the switching period $T_S$.

This general modulator works as follows. Each switching period is initiated by the constant-frequency clock signal 132 from the clock generator 130. The output Q 136 of the flip-flop FF 134 rises to logical high state as a clock-pulse arrives and each integrator 140, 152, and 160 starts integrating its input signal. When the voltage $v_+(t)$ 162 at the non-inverting-input of the comparator 166 reaches the voltage at the inverting-input 164, the comparator 166 outputs a logical-high signal 168, resetting the flip-flop 134 as well as all the integrators 140, 152, 160 through output $\overline{Q}$ 138.

Integrator 160 has an input derived from the sum of $v_2$ signal 158 and two times the output of integrator 152. The summing and doubling operations are implemented by summer 156 and doubler 154. Similarly, integrator 152 has an input derived from integrator 140 and $v_3$ signal 150 and three times the output of integrator 140. This is implemented by tripler 146 and summer 148. Also shown as inputs to integrator 140 are $v_4$ signal 144 and summer 142.

FIG. 2(b) illustrates the modulator's operation waveforms. Voltage $v_1$ signal 164 is required to be positive in this circuit. If this condition is not satisfied, without losing generality, one can change $v_1$ to positive and meanwhile change the sign of $v_2$, $v_3$, etc. respectively. This general modulator can be used for trailing-edge, leading-edge, or double-edge modulation.

(a) Trailing-edge modulation

For trailing-edge modulation, the rising-edge of the output-pulse $p_{TE}(t)$ is synchronized by the clock and the falling-edge is determined by the modulator. Since $v_1$, $v_2$, etc. are slow varying signals compared to the switching frequency, $$v_+(t)=v_2(t/T_S)+v_3(t/T_S)^2+v_4(t/T_S)^2+\ldots \quad (0<t<T_2). \quad (5)$$

The moment at which $v_+(t)=v_1$ dynamically determines the falling-edge of $p_{TE}(t)$; hence, a trailing-edge modulator satisfying (4) results. By using the flip-flop, one pulse in one switching period is guaranteed $v_+(t)$, which is a polynomial function in $(t/T_S)$, can be considered as a carrier of the modulator in this trailing-edge modulator. Its shape is determined by $v_2$, $V_3$, etc.

(b) Leading-edge modulation

In a leading-edge modulator, the rising-edge of the output pulse $p'_{LE}(t)=1-p_{LE}(t)$ is synchronized by the clock while its falling-edge is decided by modulation. This situation is similar to $p_{TE}(t)$ in the trailing-edge modulation. Thus FIG. 2(a) circuit can be used to determine $p'_{LE}(t)$ or d (4) can be rearranged to $$v_1'=(v_2'd'+v_3'd'^2+v_4'd'^3\ldots). \quad (6)$$

where $v_1'$, $v_2'$, etc. are a linear combinations of $v_1$, $v_2$, etc. Substituting d'=1-d into (6), and comparing with (4) yields $$\begin{bmatrix} v_1' \\ v_2' \\ v_3' \\ v_4' \\ \ldots \end{bmatrix} = \text{sign}(v_1') \begin{bmatrix} 1 & -1 & -1 & -1 \\ 0 & -1 & -2 & -3 \\ 0 & 0 & 1 & 3 & \ldots \\ 0 & 0 & 0 & -1 \\ & & \ldots & \end{bmatrix} \begin{bmatrix} v_1 \\ v_2 \\ v_3 \\ v_4 \\ \ldots \end{bmatrix} \quad (7)$$

where sign($v_1'$) is the sign function to guarantee $v_1$ to be positive. In FIG. 2(a), replacing $v_1$, $v_2$, ... with $v^{1'}$, $v_2'$, ... respectively results in the generalized leading-edge modulator, where $\overline{Q}$ of the flip-flop is the output-pulse $p_{LE}(t)$ which determines the duty-ratio d.

(c) Double-edge modulation

In a double-edge modulator, the center of the output-pulse is fixed in a switching cycle while both edges are modulated. The principle for constructing a double-edge modulator is shown in FIG. 3(a) with linear carriers as the example. Sum of output-pulses of leading and trailing-edge modulation, taken alternately every switching cycle, forms a double-edge modulation pulse. FIG. 3(b) shows the conceptual schematic of the modulator's output stage, where the T-FF is a toggle flip-flop 200 clocked by a clock signal 202, elements 208, 210 are AND gates, element 216 is a NAND gate, and Q 204 and $\overline{Q}$ 206 outputs feed AND gates 208, 210, respectively. Notice that the switching frequency is a half of that of the individual trailing or leading-edge modulators. Trailing edge modulator 212 products pulses $p_{TE}(t)$ and leading edge modulator 214 produces pulses $p_{LE}(t)$.

Notice that, in normal operation, the modulation equation (4) must have at least one solution d∈(0,1). If there is more than one d satisfying (4) in (0,1), the smaller or the smallest d will be the output of the modulator for trailing-edge modulation. For leading-edge modulation, on the other hand, the smaller or the smallest d'=1-d will be the output of the modulator, i.e. the larger or the largest d will be the output. For the double-edge modulation, it is necessary that (4) has one and only one solution of d∈(0,1) to avoid the circumstance that the output-pulse is not symmetrical around the pulse center. In practice, if the solution d is out of range, a minimum or maximum duty-ratio can be enforced.

(d) General PWM Control Chip Scheme

Figure 4:
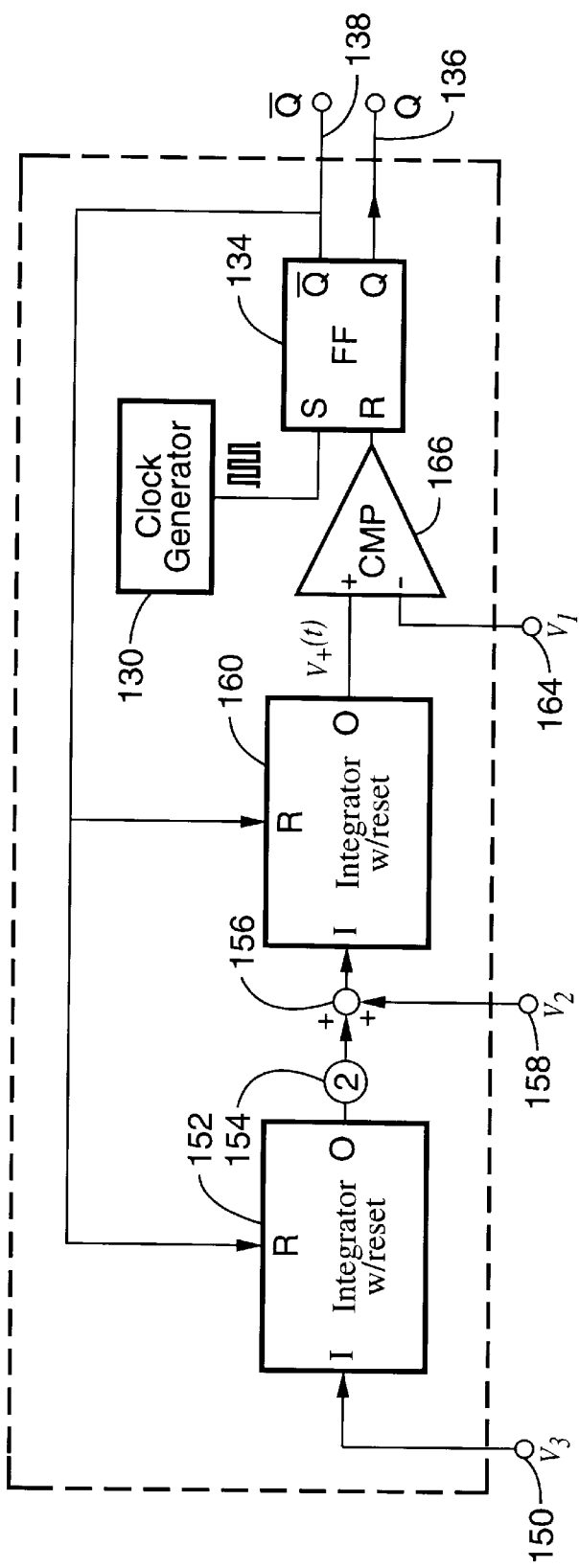
FIG. 4 is a diagram of a two stage general PWM modulator in accordance with the present invention.
Figure 20:
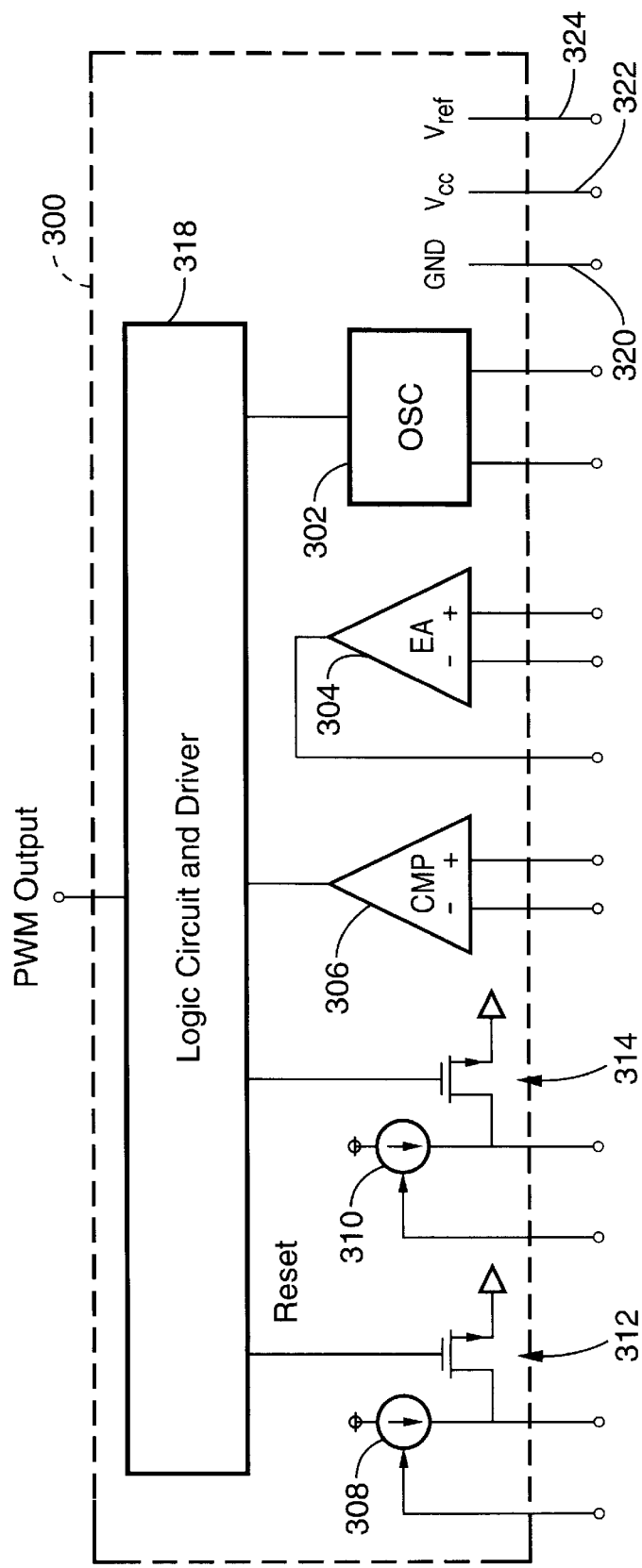
FIG. 20 is a functional block diagram of an integrated circuit implementing the modulator shown in FIG. 4.
Figure 21:
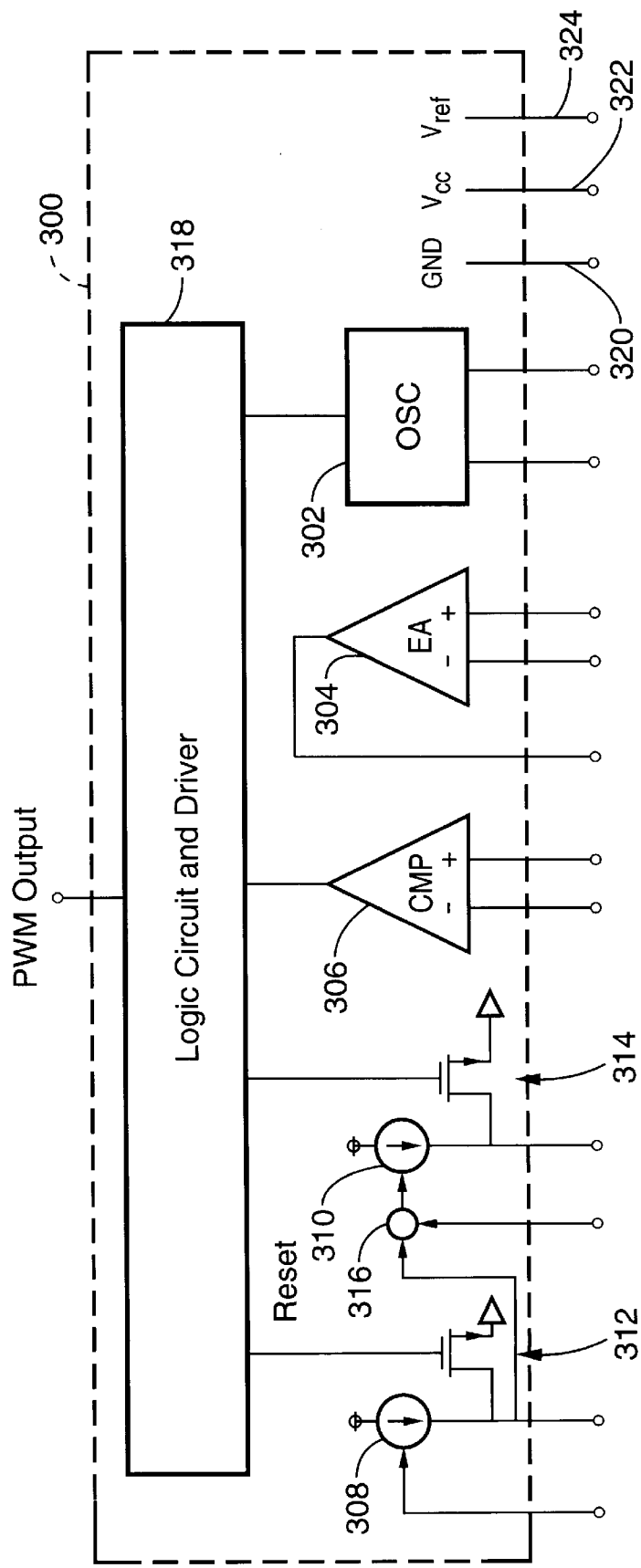
FIG. 21 is an alternative embodiment of the integrated circuit shown in FIG. 20.

For any switching converter, if the modulation equation can be expressed in (4) general-form, the modulator shown in FIG. 2(a) can be applied. In practice, two stages of integrators are sufficient for most applications, thus one embodiment of the general modulator has two integrator-stages, as illustrated in FIG. 4. In later sections, this modulator will be applied to feed-forward PWM control current-mode control of switching converters, and active power-factor-correction circuits to demonstrate its powerfulness. The modulator shown in FIG. 4 will be used as if it is an integrated circuit (IC). An example of a practical integrated circuit (IC) 300 implementing this general PWM modulator with two-stage integrator is shown in FIG. 20. As shown, IC 300 comprises several elements, which include the following. (i) a clock oscillator 302 (OSC). A timing resistor and capacitor can be connected to it to determine the switching frequency. It can also be implemented with only one output pin, in that case, only one timing capacitor is needed to determine the switching frequency; (ii) an error amplifier 304 (EA). This can be used for the output voltage feedback as in most PWM integrated circuits (iii) a voltage comparator 306 (CMP). Both input pins are accessible to give users maximal flexibility; (iv) two voltage-controlled current sources 308, 310 with reset switches 312, 314. Each of these elements can be used to construct an integrator with reset. According to the general PWM modulator scheme, a summer is required between the first and the second stage of integrators, however, most of the time a summer can be implemented easily with two resistors. Another possible implementation of the IC is to include a summer 316, as shown in FIG. 21; (v) logic circuit and driver 318. This element determines PWM logic according to the clock, CMP output, and other possible protection logic. Its output can provide driving signal to power switch; and (vi) ground 320 (GND), voltage supply 322 (Vcc), and reference voltage output 324 (Vref).

2. Applications to Feed-forward PWM Modulation

For switching converters, feed-forward compensation is effective in reducing effects of source disturbances on converter outputs, and improving stead-state and dynamic response [5–7]. In this section, a unified control circuit is presented for feed-forward PWM control and a small-signal model for a single-stage-integrator modulator is also reported.

(a) Unified feed-forward PWM controllers

When a switching converter is operating at continuous conduction mode (CCM), the dc relationship between the source $V_g$ and the output $V_o$ is determined by the conversion-ratio M(D), i.e.

$$V_o/V_E = M(D) = P(D)/Q(D) \qquad (8)$$

where P(D) and Q(D) are polynomials in steady-state duty-ratio D. Table 1 lists the conversion-ratios for various converters [7].

In order to make the output $V_o$ proportional to the modulation reference $v_m$ and independent of the source voltage $v_g$ reference [7] proposed to replace $V_o$ in reference [8] by $AV_m$, yielding the modulation equation $$v_m Q(d) = (v_g/A) P(d) \qquad (9)$$

where A is a proportional constant and $v_m$ is to control the output.

Figure 5:
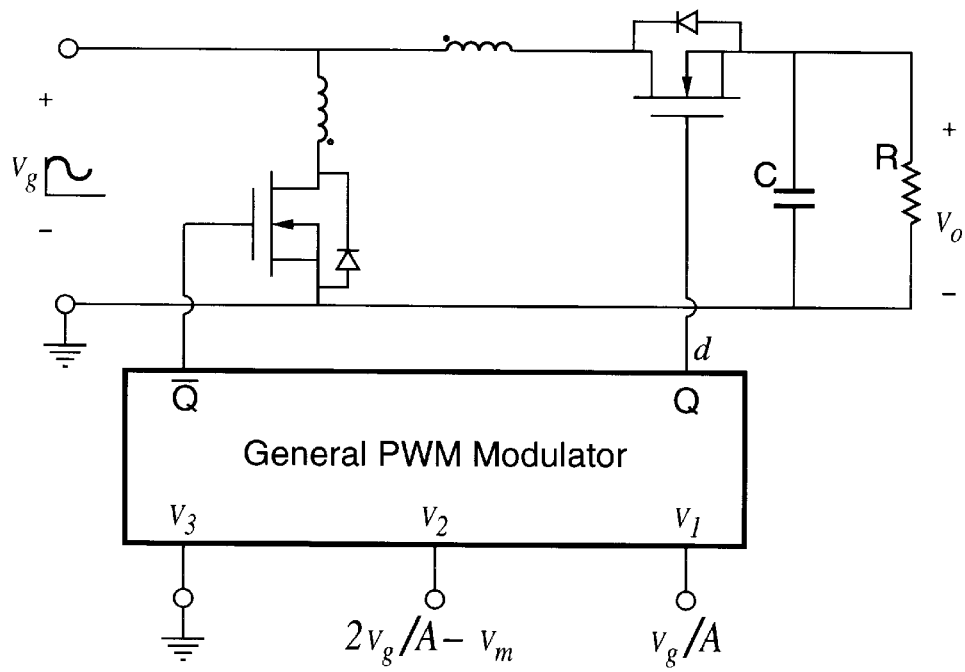
FIG. 5 is a diagram of an open-loop trailing-edge feed-forward PWM control circuit for a Watkins-Johnson converter in accordance with the present invention.
Figure 6:
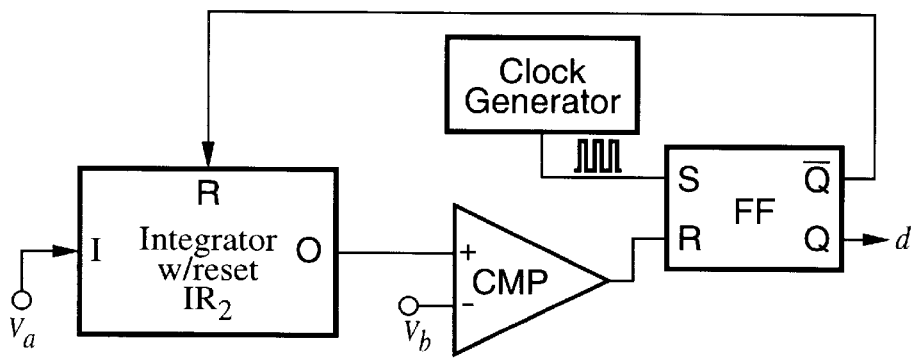
FIG. 6(a) is a diagram of a modulator circuit with one integrator stage in accordance with the present invention.
FIG. 6(b) is a diagram representing a small signal dynamic model of the circuit depicted in FIG. 6(a).
Figure 6:
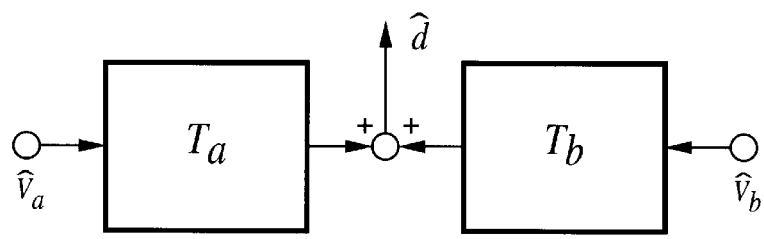
Figure 7:
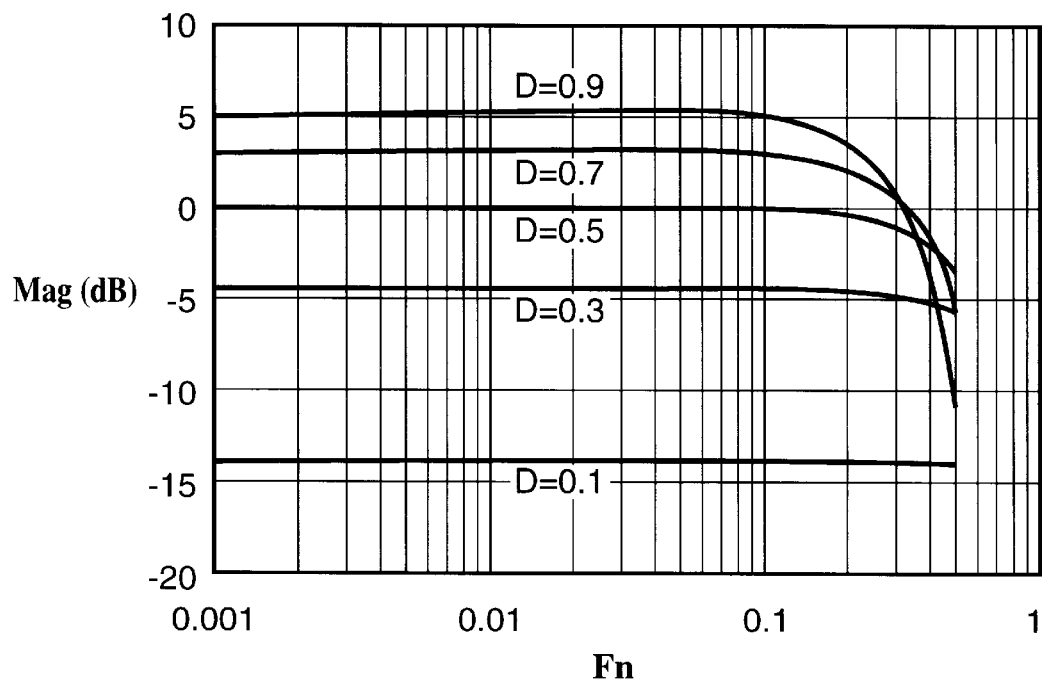
FIG. 7(a) and 7(b) are a magnitude and phase frequency response plot of the small signal model illustrated in FIG. 6(b), respectively.
Figure 7:
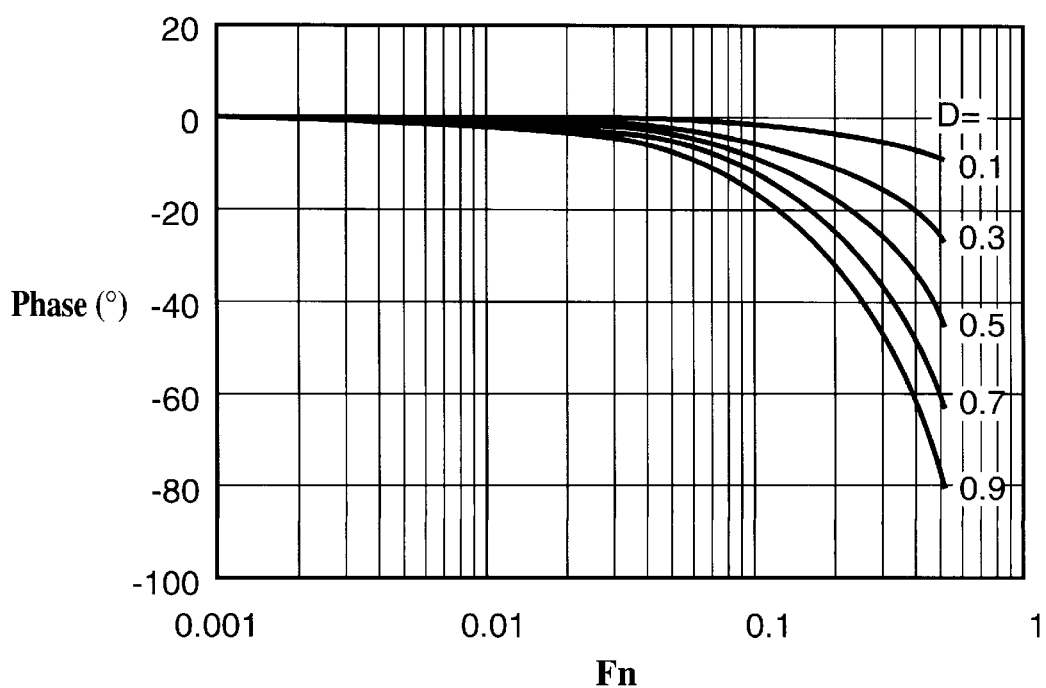

The implementation of the feed-forward PWM controllers can be unified for both trailing-edge and leading-edge modulation, using the general modulator of the present invention. The solution of (9) will lead to $V_0 = Av_m$ at steady-state. Substituting P(d) and Q(d) for each converter into (9) results in modulation equations in the general-form for the trailing-edge modulation. Note that those non-quadratic converters listed in Table 1 have linear carriers that require only one state of integrator (v3=0), while those quadratic converters need two stages of integrators (v3>0). Leading-edge modulators can be obtained using (7). The results are also listed in Table 1. Notice that these controllers require at most two stages of integrators, and can be implemented with the general modulator shown in FIG. 4 (two stages) or in FIG. 6 (one stage). FIG. 5 is an open-loop feed-forward PWM controlled Watkins-Johnson converter and illustrates how to apply Table 1.

(b) Small-signal Dynamic Model of Feed-Forward Controlled Converters

To characterize the small-signal dynamics of feed-forward controlled converters, one can separate the whole converter system into two parts, i.e. the power stage and the modulator. The models of power stages have been established in [8] and the model of the modulator need to be derived.

(i) Small-signal Model of the Modulator

The modulator with one integrator-stage is used as an example to illustrate the model of the modulator. Modulators with more than one integrator-stage are more complicated but can be analyzed similarly. The analytical result from [9] is used as the basis of this analysis and is restated as follows:

For an input with perturbation $v_c(t) = V_c + v_C = V_C + v_{cp}$ sin (wt−θ), if the corespondent trailing-edge duty-ratio is $d_k = D + d_{p1} \sin[(k-1)wt - \theta \phi_{m1}]$, then the magnitude of the modulator's small-signal transfer function is $$|T| = |\hat{d}/\hat{v}| = d_{p1}/v_{cp} \qquad (10)$$

and the phase log is $$\angle T = \omega DT_s + \phi_{m1} \qquad (11)$$

The single integrator-stage modulator, shown in FIG. 6(a), has two inputs $v_a$ and $v_b$ and one output duty-ratio d. Its small-signal model is shown in FIG. 6(b). For trailing-edge modulation, when input $v_a = V_n + v_a = V_o + v_{ap} \sin(wt - \theta)$ is applied, the duty ratio was found to be $$d_k = D - (2/\omega T_s)(v_{sp}/V_a)\sin(0.5\omega d_k T_s)\sin[(k-1)\omega t - \theta + 0.5\omega d_k T_s] \qquad (12)$$

The small-signal assumption yields $d_k \approx D$, thus $$T_a = |T_a| \angle T_a = -(2/\omega T_s)(1/V_a)\sin(0.5\omega DT_s)\angle 0.5\omega DT_s. \qquad (13)$$

The transfer function from $\hat{v}_b$ to duty-ratio $\hat{d}$ is the naturally-sampled PWM, thus the result in [9] can be directly applied, hence, assuming that the integrator time-constant $T_i$ equals the switching period $T_s$ gives rise to $$T_b = |T_b| \Phi T_b = (1/V_b) \Phi 0, \qquad (14)$$

which is a real number. The magnitude and phase of $T_a$ are plotted in FIG. 7(a) and 7(b), respectively where $f_s$ is the switching frequency and Fn=f/$f_s$ is the normalized frequency. FIG. 7(a) and 7(b) indicates that at low frequency, the modulator gain $T_a$ can be considered as a frequency-independent real number. $T_a$ and $T_b$ may be used later for modeling the switching converters.

For a single integrator-stage leading-edge modulator, (10) to (14) are still valid except that the following modifications need to be done, i.e. d be replaced by d'=1−d, D be replaced by D'=1−D, $\hat{d}$ be replaced by $\hat{d}' = -\hat{d}$.

(ii) Small-signal models of the feed-forward controlled converter

Figure 8:
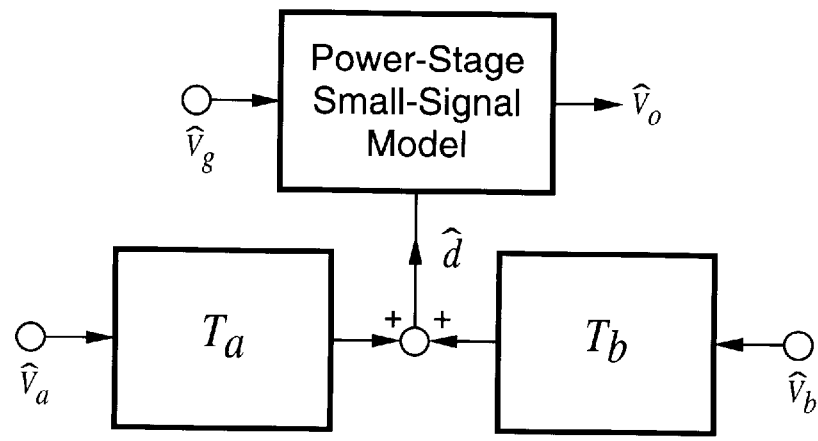
FIG. 8 is a diagram representing a small signal model of a switching converter in accordance with the present invention.

Small-signal models for the feed-forward controlled converters can be obtained by combining the model of the modulator and the model of the power stage, as shown in FIG. 8. For example, for the trailing-edge feed-forward controlled buck converter, $\hat{v}_c = \hat{v}_g$ and $\hat{v}_b = \hat{v}_m$. When the output low pass filter is not taken into account, the transfer function from $\hat{v}_g$ to $\hat{v}_o$, i.e. the ripple rejection or the audio susceptibility, was found to be $$\frac{\hat{v}_o}{\hat{v}_g} = \sqrt{(A^2 + B^2)} \angle \tan^{-1} B/A \qquad (15)$$

where $$A = D - \sin(0.5\omega DT_s)/(\omega T_s), \qquad (16)$$

$$B = \sin^2(\omega DT_s)(0.5\omega T_s), \qquad (17)$$

Figure 9:
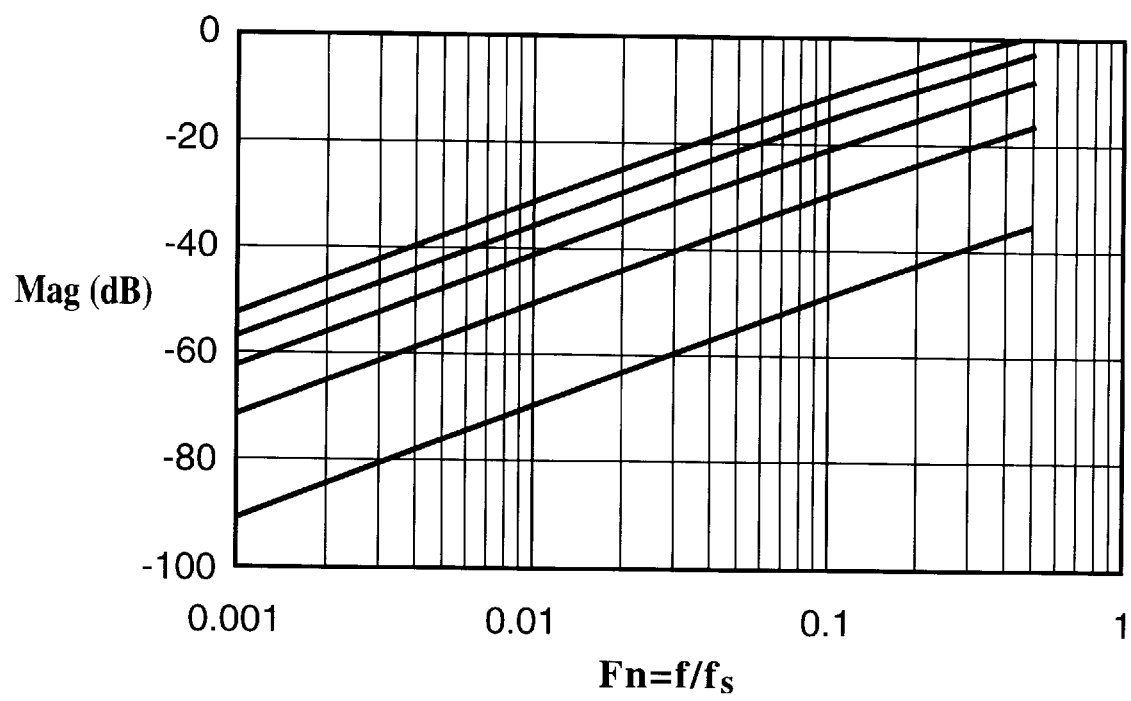
FIG. 9 is a plot showing the ripple rejection for a feed-forward controlled buck converter in accordance with the present invention.
Figure 10:
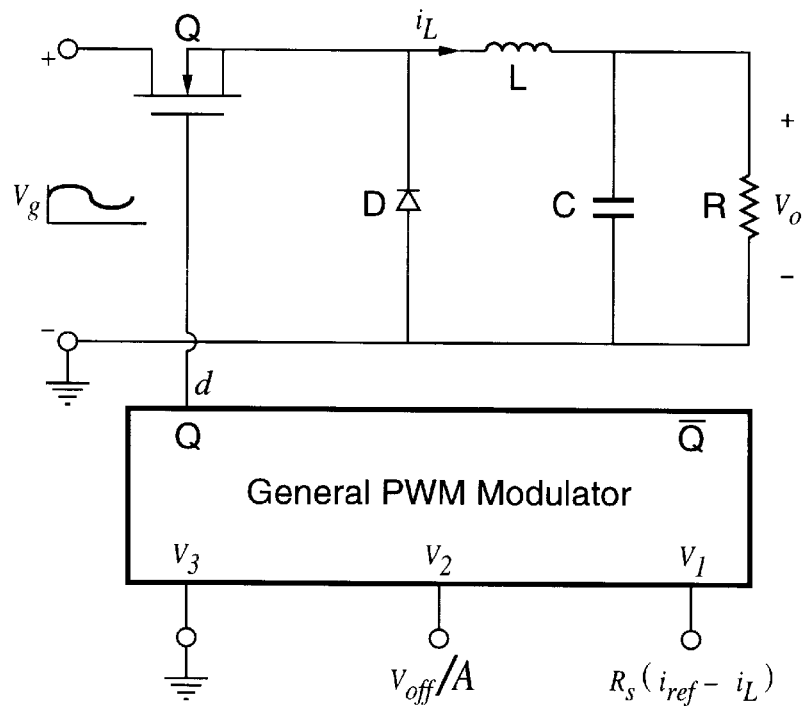
FIG. 10 is a diagram of a buck converter under current mode control with linear compensating slope in accordance with the present invention.

FIG. 9 shows the magnitude plot of (15) at normalized frequency for duty-ratio D=0.1, 0.3, 0.5, 0.7, 0.9 respectively. This result is consistent with the result reported in [5], but the expression is much simpler.

3. Application to Current-mode Control

The general modulator can also be applied to current-mode control, as described in references [10] and [11]. FIG.

10 shows a buck converter under current-mode control with linear compensating slope, where $i_{ref}$ is the current reference, $i_L$ is the inductor current, and $R_S$ is the equivalent sensing-resistance. The compensating-slope is determined by input $v_2$. Optimum compensating slope for the current mode control can be achieved by selecting $v_2=V_{eff}/A$, where A is a constant determined by circuit parameters and $v_{off}$ is equal to $v_g$ for buck converter, $v_o$ for boost converter, and $v_g+v_o$ for buck-boost converter respectively [13].

Figure 11:
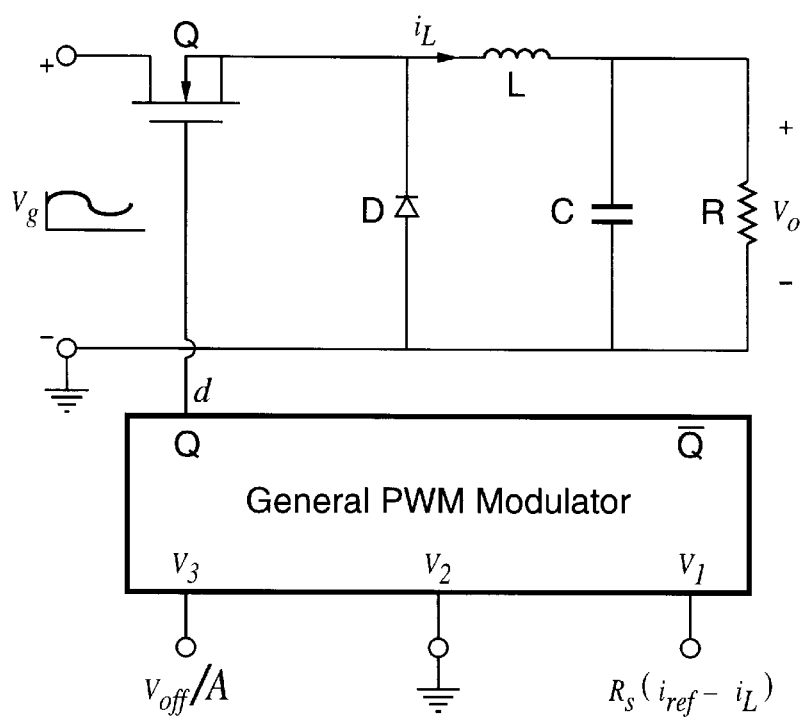
FIG. 11 is a diagram of a buck converter under current mode control with a non-linear compensating slope in accordance with the present invention.
Figure 12:
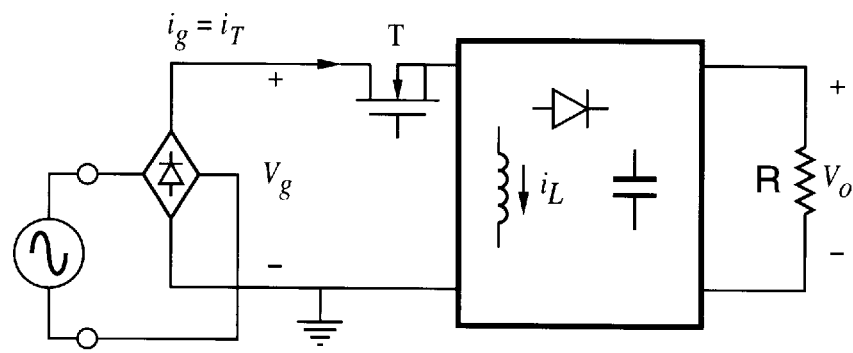
FIG. 12(a) and FIG. 12(b) are diagrams depicting a general configuration of a single-phase PFC circuit.
Figure 12:
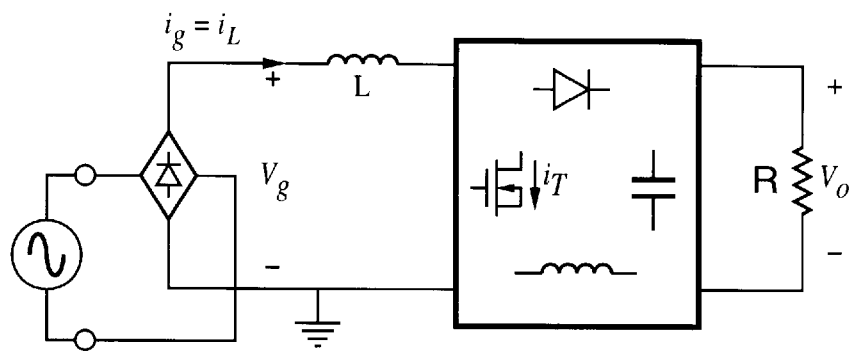
Figure 13:
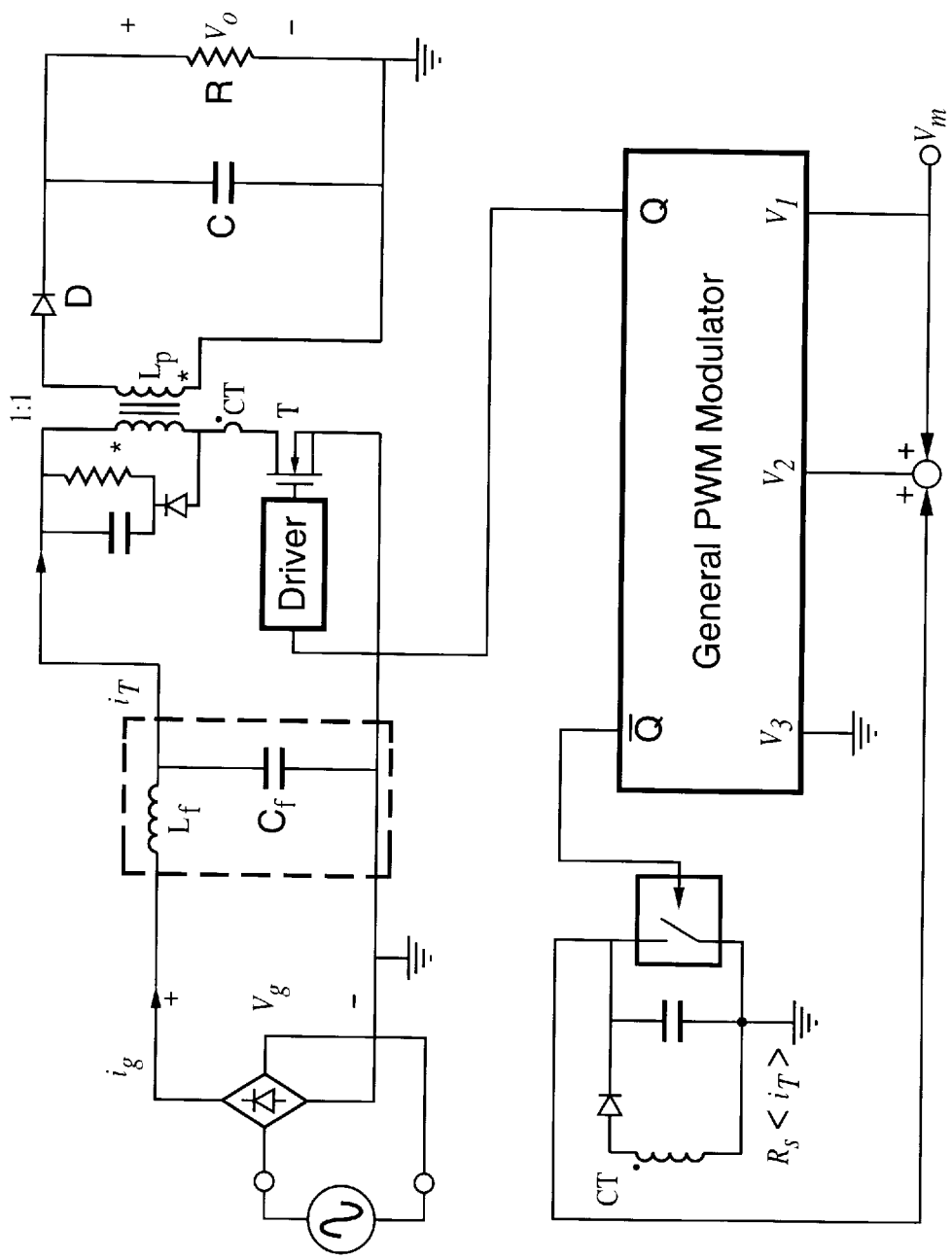
FIG. 13(a) is a diagram depicting a trailing edge controller for single phase PFC circuits based on flyback topology with average switch current control in accordance with the present invention.
FIG. 13(b) is a diagram depicting a trailing edge controller for single phase PFC circuits based on flyback topology with switch-current control in accordance with the present invention.
Figure 13:
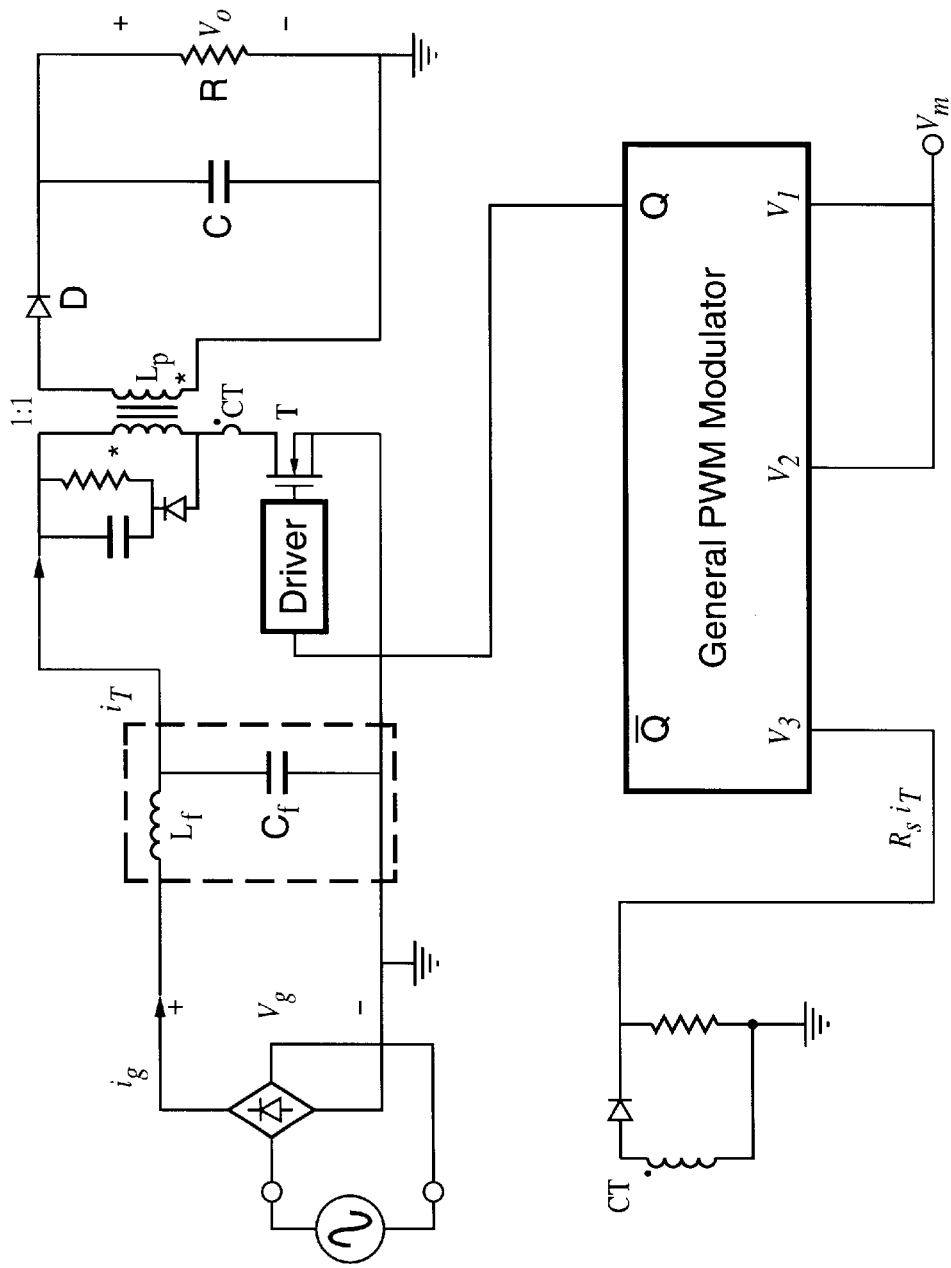

Current-mode control with nonlinear compensating-slope was proposed for dc-ac conversion in reference [12]. This control method have some very unique features as described in references [12] and [13]. The modulation equation for this control method can be written as $$i_{ref} - i_L = d^2 f_{eff} T_S/(2L), \quad (18)$$

where L is the inductance. FIG. 11 gives an example of current-mode controlled buck converter with nonlinear-compensating-slope.

4. Application to Active Power-Factor-Correction

A single-phase diode-bridge-rectifier followed by a dc-dc converter forms a rectifier with active power factor correction, or PFC. The dc-dc converter is controlled in such a way that the input voltage $v_g$ and the average input current $i_g$ have the same shape. Such a dc-dc converter is called a "Resistor Emulator." The control strategies for active power-factor-correctors used to have multiplier approach and voltage-follower approach, as shown in reference [14]. Non-linear-carrier-control was recently proposed in reference [15] for the boost converter and was extended to other topologies in reference [16]. This control approach has the simplicity of the voltage-follower approach while it has the high performance as the multiplier approach. However the non-linear carrier is very difficult to obtain for some topologies. The carrier described in reference [16] must be approximated, with a fairly large minimum duty-ratio $d_{min}$ (=0.22) which leads to a limitation of load range at the light end. This section describes a class of PFC controllers which has the properties of the non-linear-carrier-control and can be easily implemented by the general modulator of the present invention.

For a dc-dc converter to be suitable as a PFC circuit, the converter should be able to step-up [14]; this condition excludes the buck converter and buck-derived converters, such as the forward converter, as PFC circuits.

This class of PFC circuits operate at CCM, therefore, current sensing is required. The following control methods are valid depending on how the current is sensed:

(1) average inductor current control,
(2) instant inductor current control,
(3) instant switch current control,
(4) average switch current control.

If the converters are assumed to operate at CCM and the inductor current has small ripple, the peak inductor current can be approximated as the average inductor current, hence, they can be treated as the same method, called inductor-current control. If these assumptions are not satisfied, the current will have larger distortion; however, the current distortion may still meet any regulation standard.

The component immediately following the bridge rectifier in a PFC circuit can be a switch or an inductor when the electromagnetic interference (EMI) filter is ignored, as shown in FIG. 12(a) and FIG. 12(b). FIG. 12(a) represents converters that have a switch in series with the rectifier, such as the buck-boost converter. FIG. 12(b) shows converters have an inductor in series with the rectifier, such as the boost or the Cuk converters, etc. For both types of converters, the control goal is $$<i_g> = v_g/R_e \quad (19)$$

where $R_e$ is the emulated resistance. At quasi-steady state in a line cycle, $$v_g = v_o/M(d). \quad (20)$$

Thus $$R_e<i_g> = v_m/M(d), \quad (21)$$

where $$v_m = R_S v_o/R \quad (22)$$

and $R_S$ is the equivalent current-sensing resistance. For a dc-dc converter at CCM and with small current ripple, the instant switch-current $$i_T = N(d)i_L \quad (23)$$

when the active switch is on, and instant diode-current $$i_D = N(d)i_L \quad (24)$$

when the diode is on, where function N(d) is the ratio of two polynomials in d, like M(d) in section 2. N(d) values for various topologies are listed in Table 2. In the following of this section, the controllers for the FIG. 12(a) and 12(b) configurations are derived. The derivation are summarized in Table 2.

(a) DC-DC Converter with Configuration Depicted in FIG. 12(a)

(i) Trailing-edge Modulation

For the converter type shown in FIG. 12(a), average currents $$<i_g> = <i_T>. \quad (25)$$

Combining with (21) gives $$R_S<i_T> = v_m/M(d) = v_m Q(d)/P(d). \quad (26)$$

(26) gives the trailing-edge average-switch-current control modulation equation. This equation is the basis of non-linear-carrier-control. The required non-linear-carrier $v_m/M$ $(t/T_S)$ for $0<t<T_S$ is a rational function of $(t/T_S)$, therefore, is very difficult to generate sometimes. However if (26) is rearranged into the general format as (4), the carrier becomes a polynomial in $(t/T_S)$, which can be implemented with the general modulator. Mathematically, this rearrangement will not change the solution value of d. The average-switch-current is the integration of the instant switch-current, as shown in examples later.

During $t \in [0, dT_S]$, $$i_T d = <i_T>, \quad (27)$$

thus $$R_S i_R d = v_m/M(d) = v_m Q(d)/P(d). \quad (28)$$

(28) yields the trailing-edge instant-switch-current control modulation equation.

Substituting (23) into (28) yields $$R_S i_L d = v_m/[M(d)N(d)]. \quad (29)$$

This yields the inductor-current control modulation equation.

(ii) Leading-edge modulation

From (29) one can obtain a leading-edge inductor-current control modulation equation by applying (7). During $t \in [0,$ d'$T_S$], (24) holds. Substituting (24) into the inductor-current control equation yields the instant-switch-current control modulation equation. Finally, substituting $$<i_D> = d'i_D \qquad (30)$$

into the switch-current control equation results in the average-switch-current control modulation equation for leading-edge.

(b) DC-DC converter with FIG. 12(b) configuration
 (i) Trailing-edge modulation
 For the type shown in FIG. 12(b), $$<i_g> = <i_L>. \qquad (31)$$

Substituting (31) into (21) yields $$R_S<i_L> = v_m/M(d) \qquad (32)$$

This equation gives the inductor-current control $$R_S i_L = v_m/M(d) \qquad (33)$$

Substituting (23) into (33) yields the instant-switch-current control modulation equation.

$$R_S i_r = [v_m N(d)]/M(d) \qquad (34)$$

Finally, substituting (27) into (34) yields the average-switch-current control.

$$R_S<i_r> = [v_m dN(d)]/M(d) \qquad (35)$$

(ii) Leading-edge modulation

Applying (7) to (33) leads to the leading-edge inductor-current control modulation equation. Substituting (30) into the inductor-current control gives the instant-switch-current control. Finally, one can use (23) to get the average-switch-current control leading edge modulation equation.

Notice in Table 2 that most leading-edge controllers are more complex than trailing-edge counterparts. There are exceptions such as the boost converter. A very simple but still high performance controller is found for the boost converter.

Figure 22:
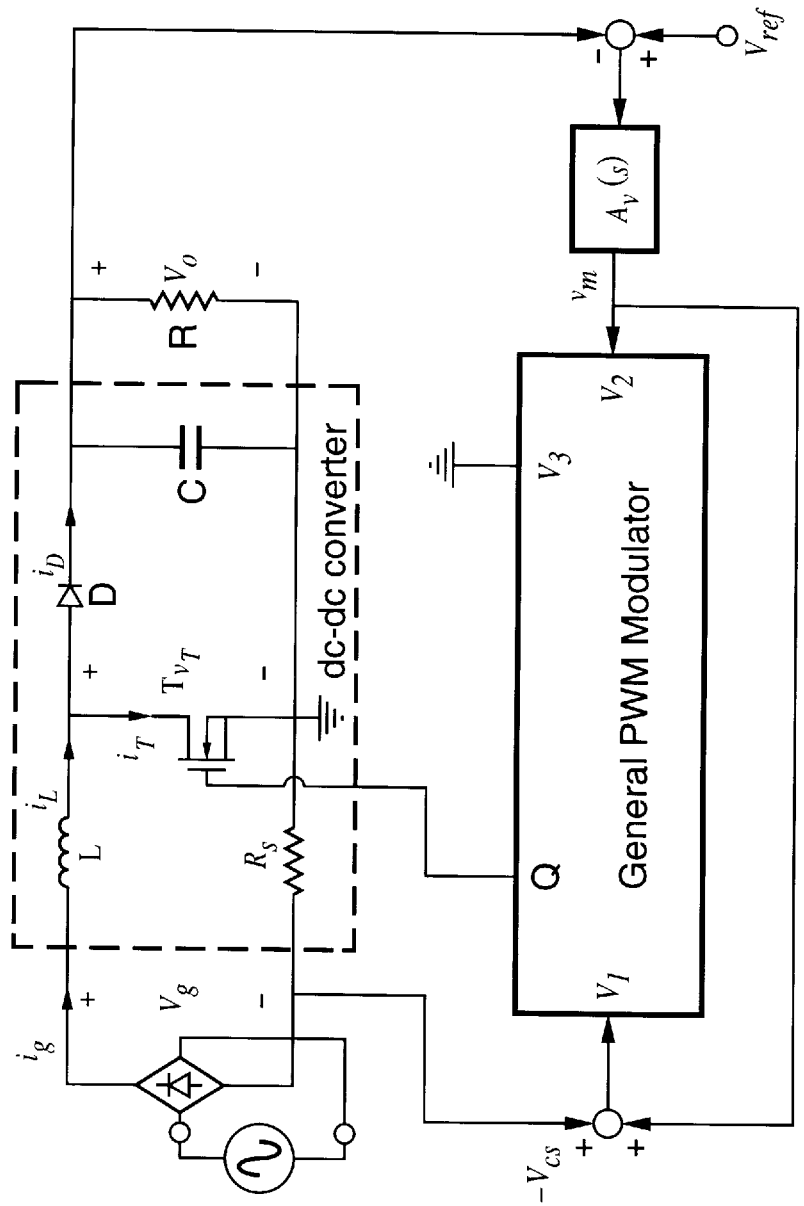
FIG. 22(a) through FIG. 22(f) show six embodiments of controllers for a PFC boost converter where the general PWM modulator is the two-stage modulator shown in FIG. 4 and $A_v(s)$ represents a feedback compensation transfer function.
Figure 22:
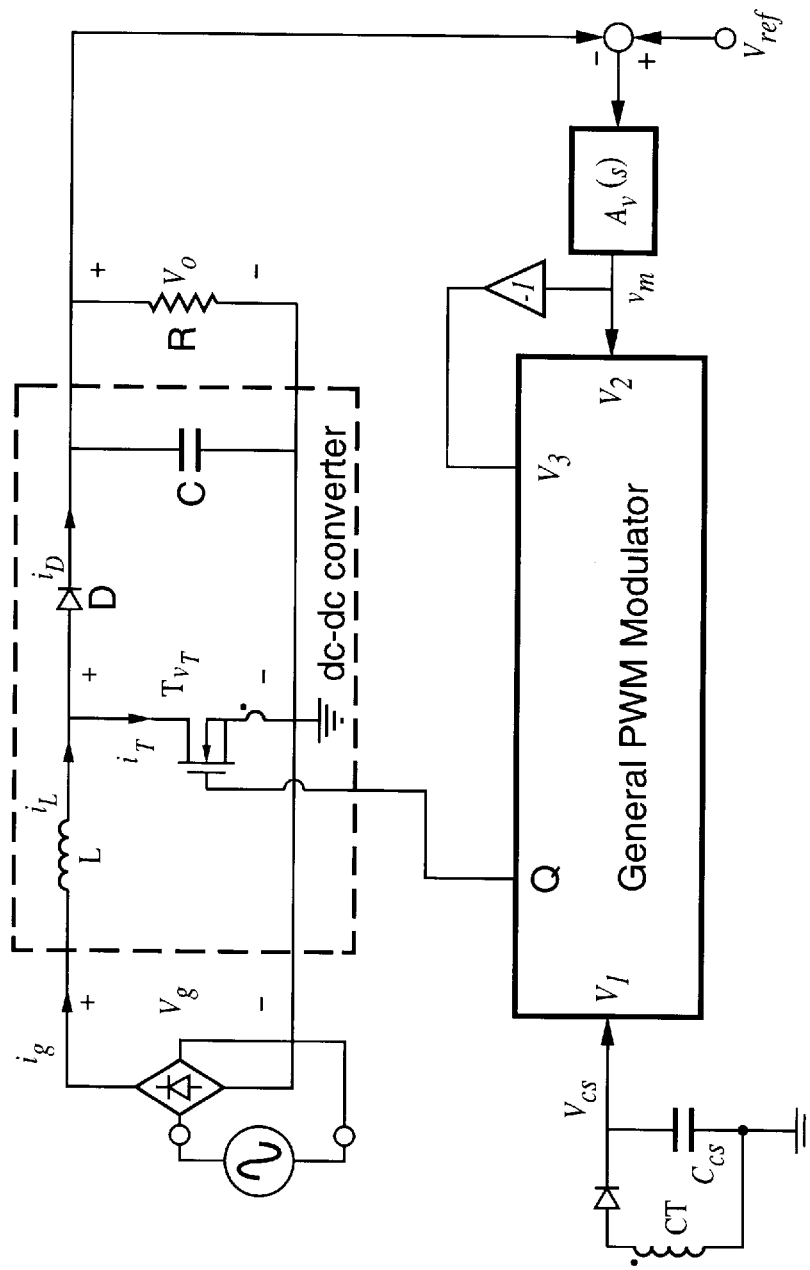
Figure 22:
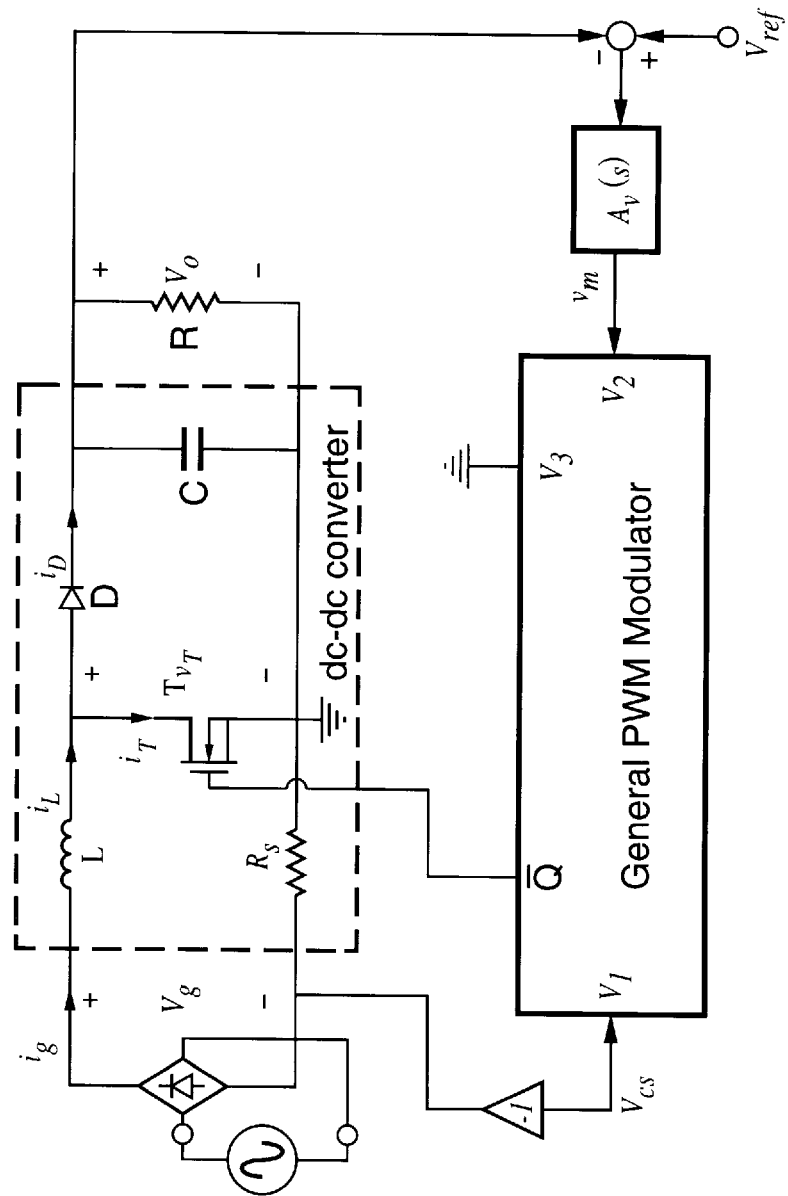
Figure 22:
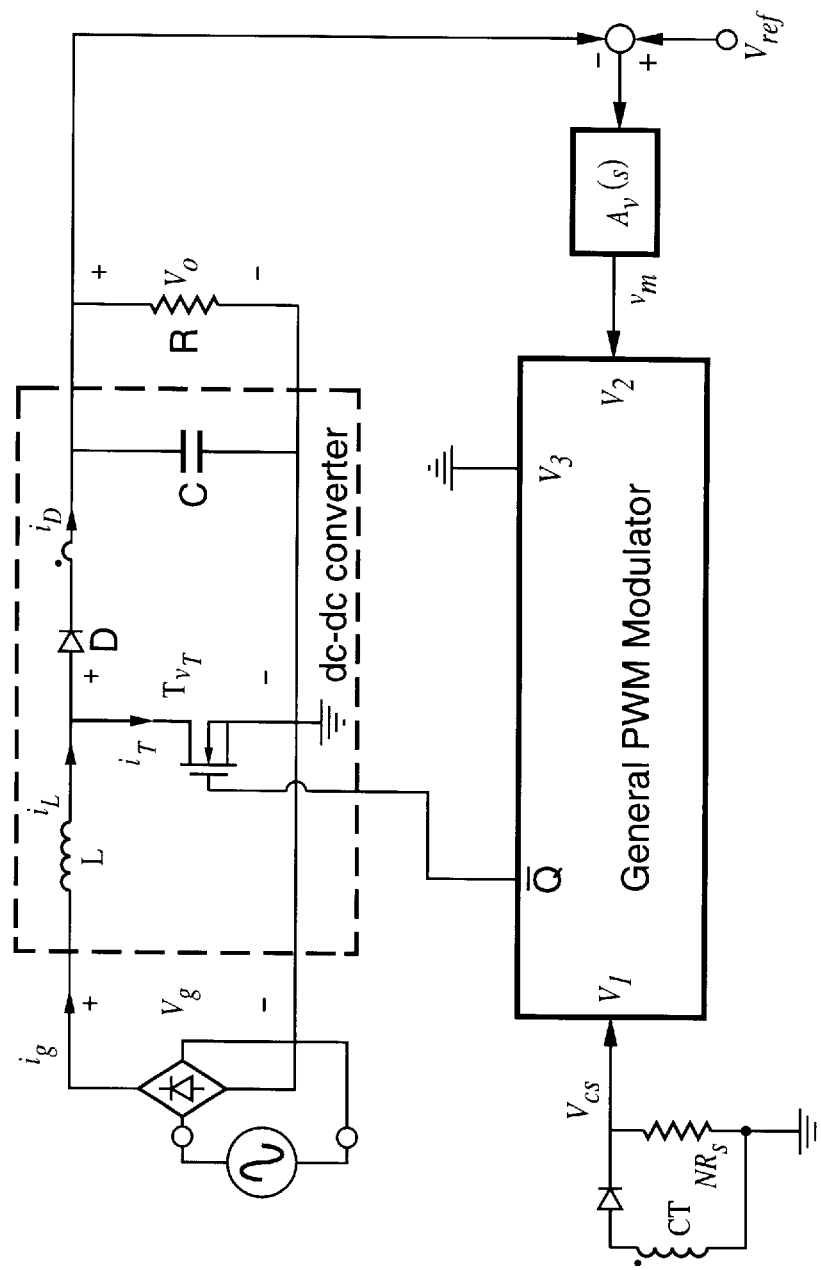
Figure 22:
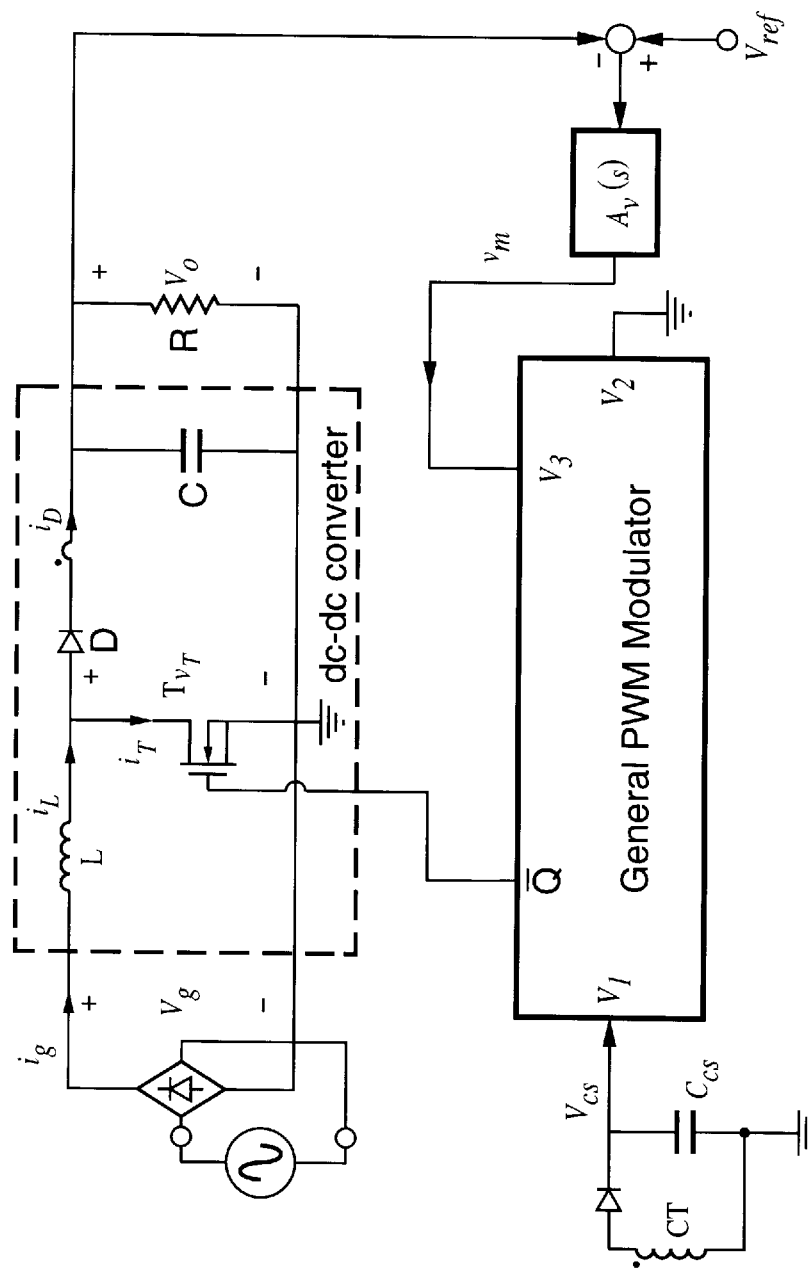
Figure 23:
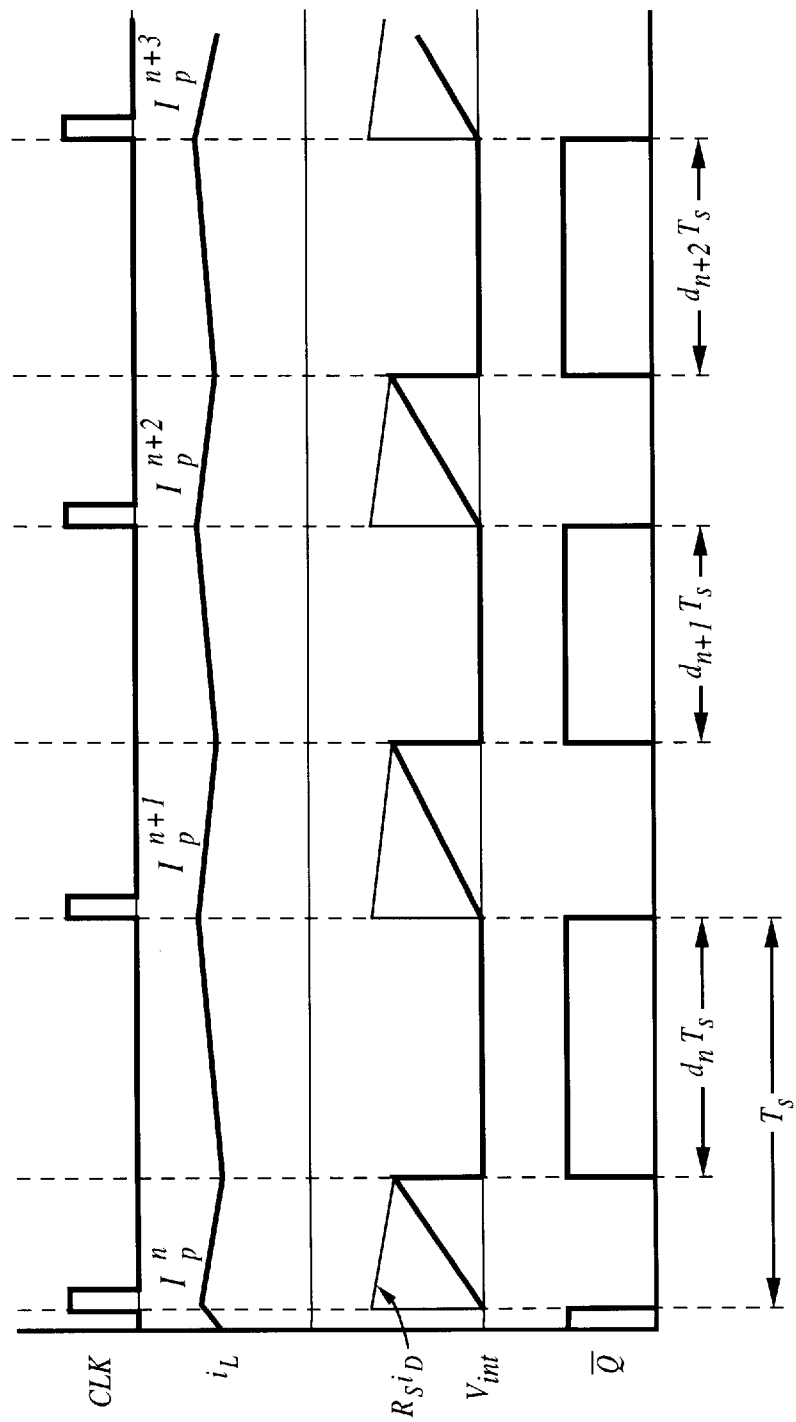
FIG. 23 is shows an example of operation waveforms for the leading-edge modulated boost PFC converter shown in FIG. 22(e).
Figure 24:
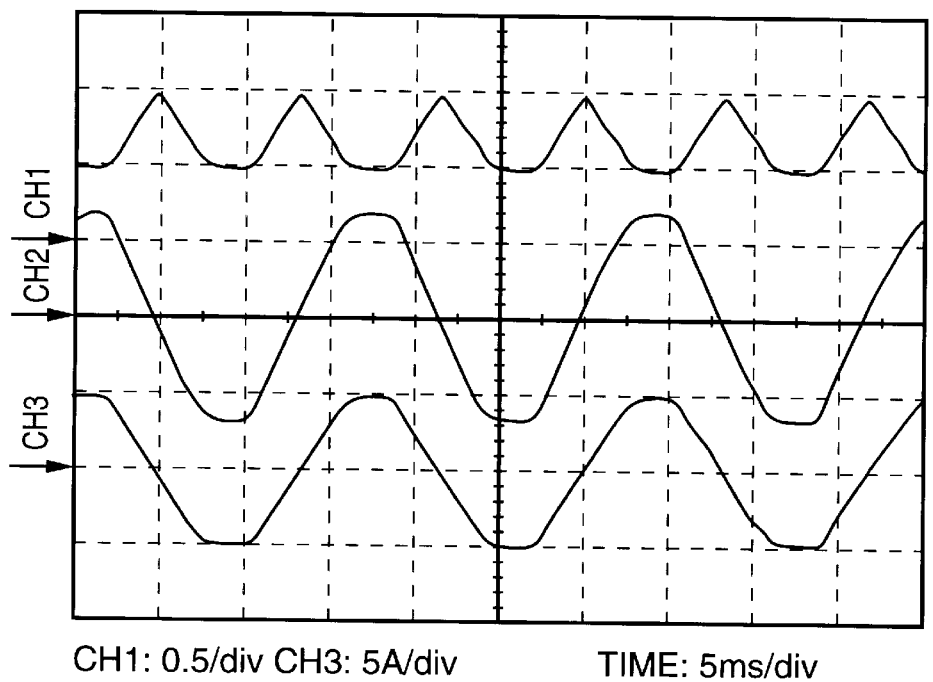
FIG. 24(a) through FIG. 24(c) are experimental waveforms at different load power levels for the boost PFC converter shown in FIG. 22(e). The traces are as follows. Top: duty ratio (0.5/div); Middle: line voltage (110 Vrms); Bottom: line current, 5A/div, 2A/div, and 0.5A/div respectively for FIG. 24(a) at full load, FIG. 24(b) at 40% of full load and FIG. 24(c) at 10% of full load.
Figure 24:
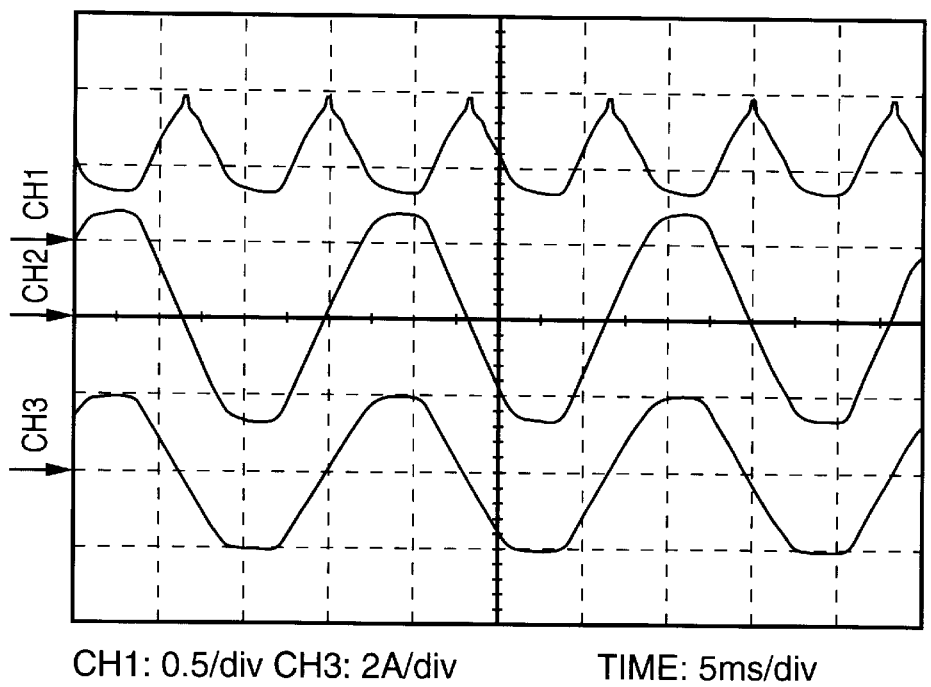
Figure 24:
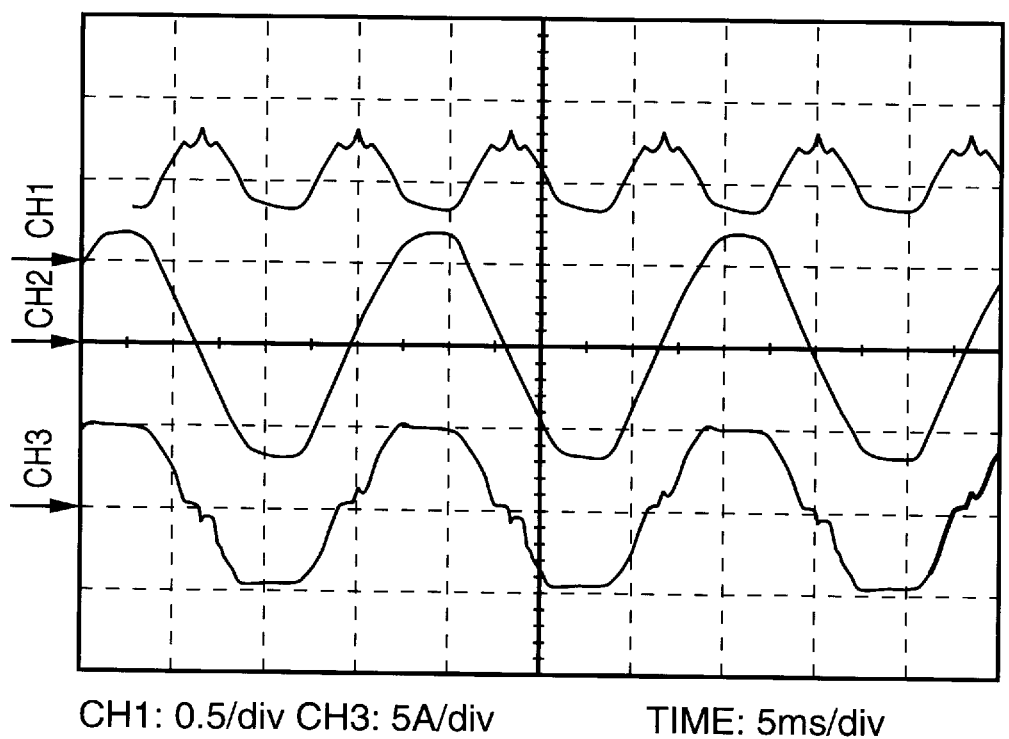

With Table 2 derived, one can easily construct various controllers for different PFC power-stage topologies. FIG. 22 shows six different controllers for boost converter where the general PWM Modulator is the two-stage modulator shown in FIG. 4 and $A_v(s)$ represents a feedback compensation transfer function. FIG. 23 shows an example of operation waveforms for the leading-edge modulated boost PFC converter shown in FIG. 22(e).

(c) Comparison to Non-linear-Carrier-Control

Comparisons of the PFC controllers listed in Table 2 to the non-linear-carrier-control for the boost and flyback converters are as follows.

(1) Boost converter.

The trailing-edge average-switch-current control listed in Table 2 is the same control method as the non-linear-carrier-control described in [15]. The instant-switch-current control in Table 2 is an approximation of the peak current non-linear-carrier control proposed in reference [15]. Accurate instant-switch-current control can be obtained through the same derivation as (13) in reference [15] which fits right into the general modulator.

(2) Flyback or buck-boost converter.

The trailing-edge average-switch-current control is similar to but not same as the non-linear-carrier-control. As described in reference [16], the carrier is an approximation, thus the error may lead to current distortion. Furthermore, that implementation has a minimal duty-ratio, which does not allow the converter to operate at light load. These two drawbacks do not exist in the embodiment of the present invention described herein. FIG. 13(a) and FIG. 13(b) are trailing-edge-modulated open-loop circuits for average-switch-current and switch-current control of the flyback converter (isolated version of the buck-boost converter) to illustrate how to combine Table 2 and the general modulator. The average-switch-current is obtained by integrating the switch-current cycle-by-cycle.

5. Application to PFC Circuit Operating at DCM

Figure 14:
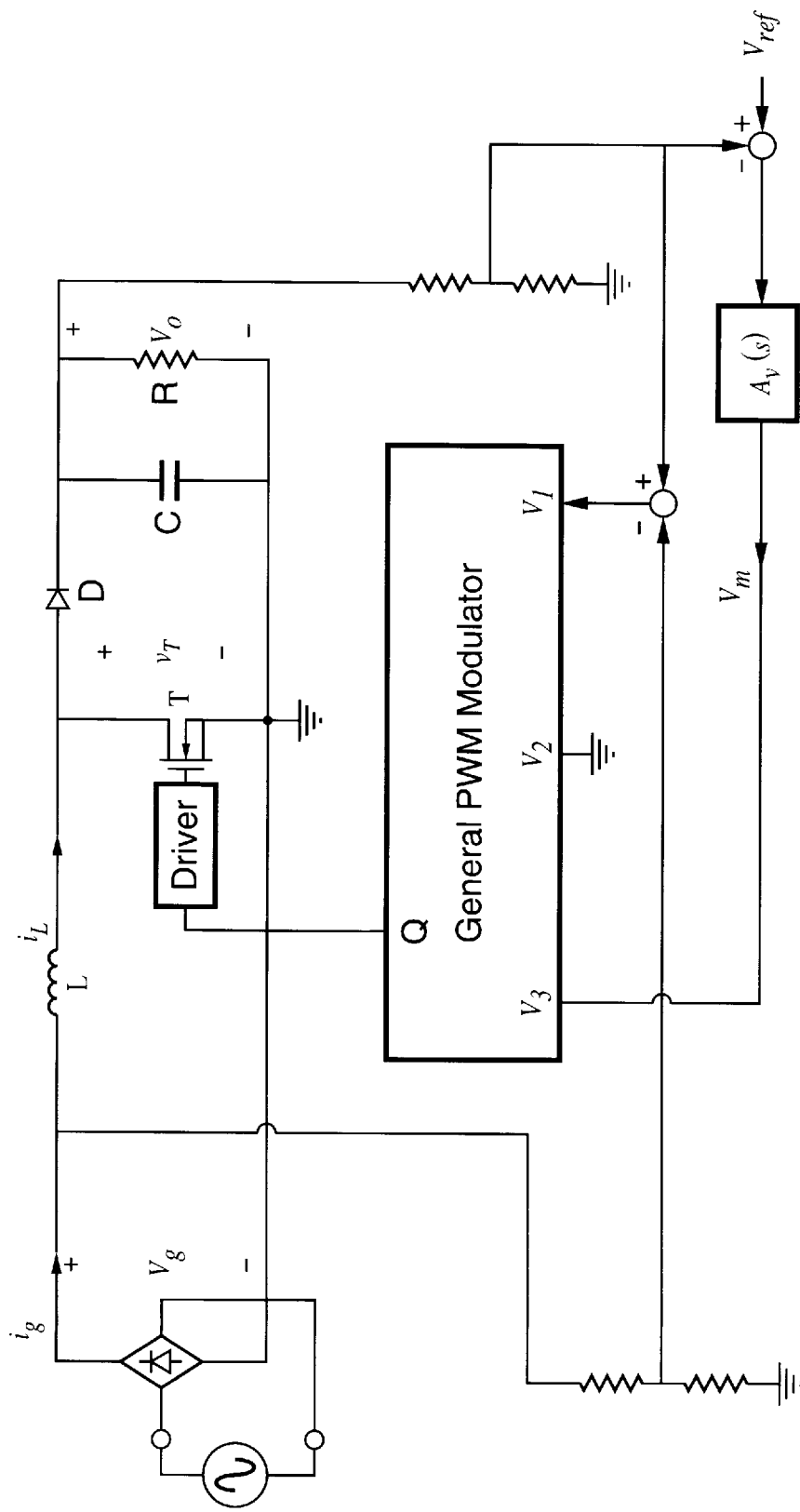
FIG. 14 is a diagram of a closed-loop controller for a boost converter operating in discontinuous conduction mode in accordance with the present invention.

Other applications and embodiments of the general modulator disclosed herein are also possible. A good example is the PFC circuits operating at DCM [17]. When a boost PFC circuit converter operates at DCM, constant switching frequency, and constant duty-ratio, the line current exists distortion. In order to eliminate the distortion, the duty-ratio is required to satisfy $$A(v_0 - v_g) = v_m d^2 \qquad (36)$$

where A is a constant determined in the circuit parameters [17]. Thus the PFC circuit can be obtained as shown in FIG. 14. Experimental verification was given in [17]. Same principle can be applied to Cuk and Sepic converters. For these two converters, the modulation equations are same as (36), except that $v_o$ in (36) need to be replaced with the energy-transfer-capacitor voltage $v_c$ and $v_c+v_o$ respectively for the Cuk and the Sepic converters. Further details can be found in reference [17].

6. Experimental Data

Two PFC circuits were used to verify the validity of the embodiment of the present invention shown in FIG. 4 and possible controllers listed in Table 2. These two circuits are the trailing-edge average-switch-current-controlled flyback converter, which was verified by building an experimental circuit, and the leading-edge switch-current-controlled boost converter, which was verified by PSPICE simulation.

(a) Experimental Verification of the Flyback PFC Circuit

Figure 15:
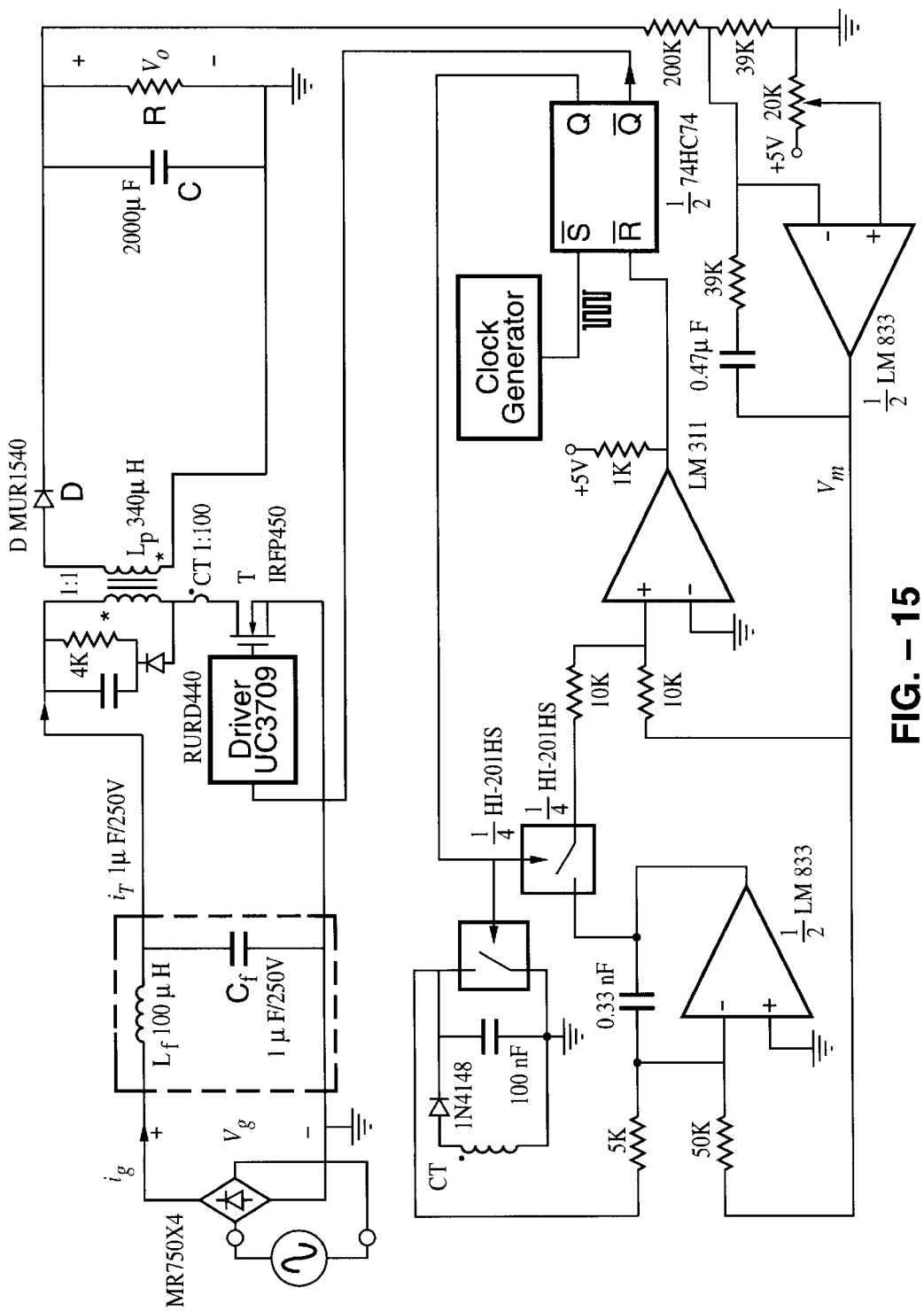
FIG. 15 is diagram of one implementation of a flyback PFC circuit in accordance with the present invention.
Figure 16:
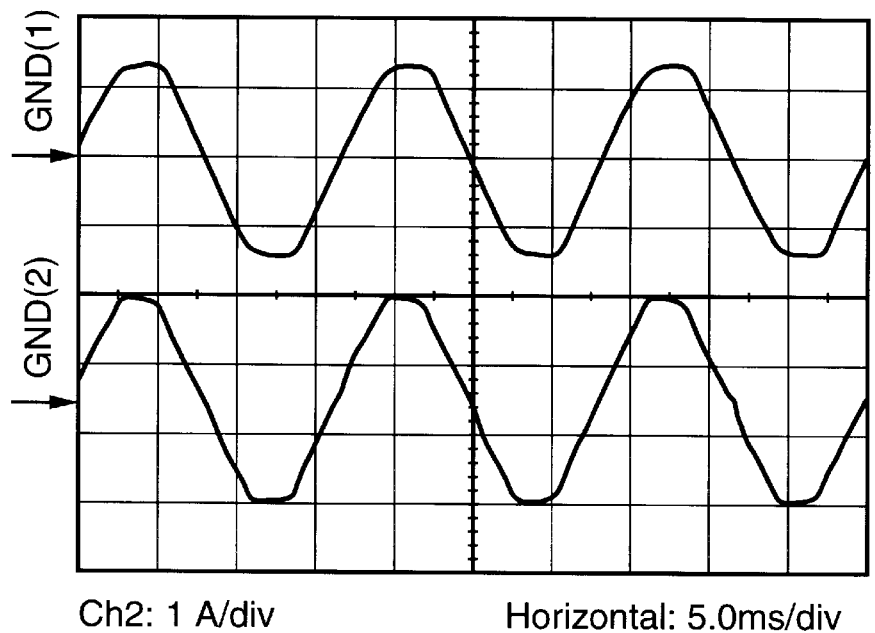
FIG. 16(a) and FIG. 16(b) are plots of experimental results for the flyback PFC circuit depicted in FIG. 15.
Figure 16:
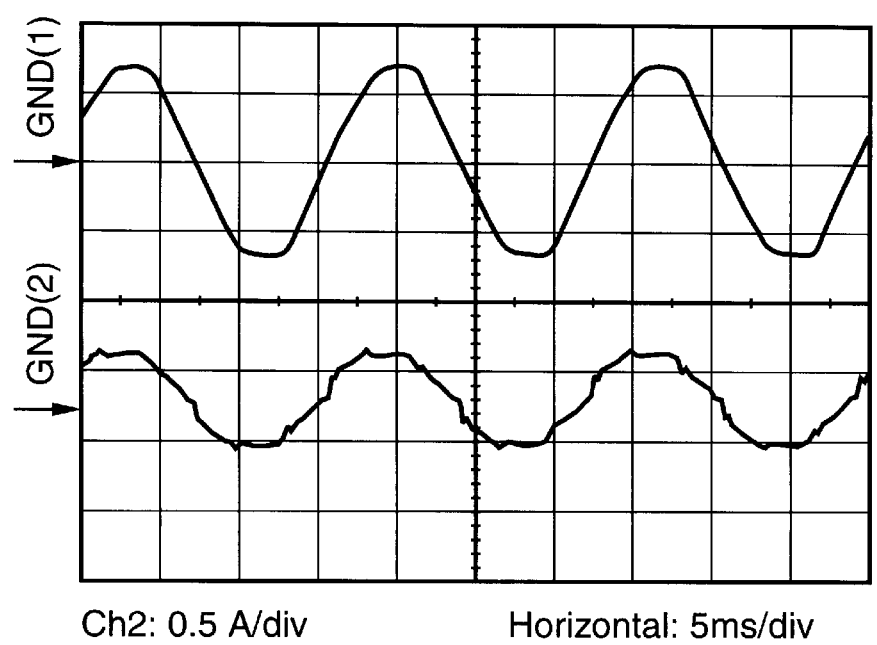
Figure 17:
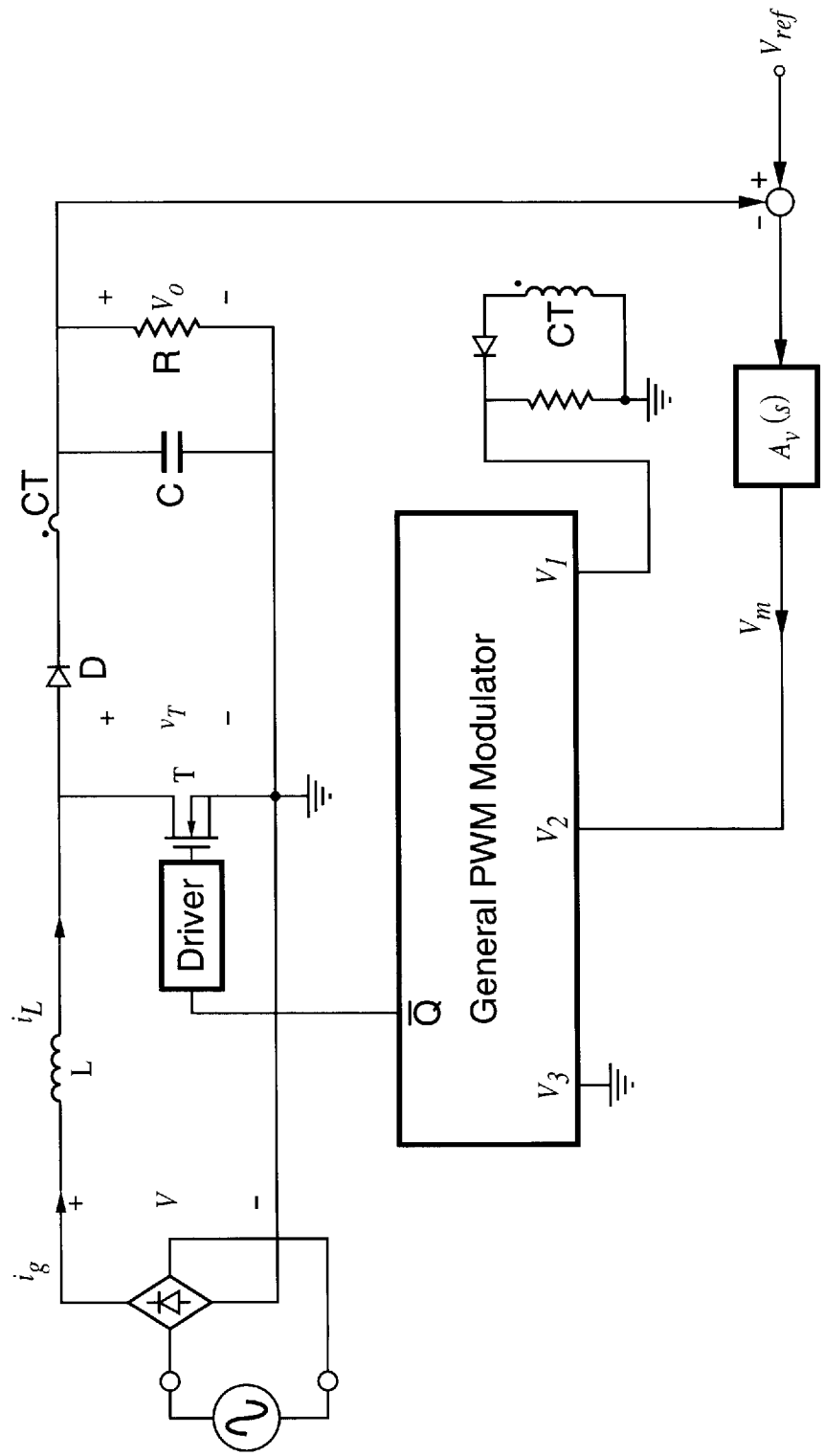
FIG. 17 is a diagram of a leading edge controller for boost converter power factor control in accordance with the present invention.

The experimental circuit and component selections are shown in FIG. 15. The power rating for this converter is 100 watts, operating at 60 KHz switching frequency. This circuit corresponds to that shown in FIG. 13(a). FIG. 16(a) and FIG. 16(b) demonstrate line current waveforms at full load and 20% of full load respectively at 115 Vrms line voltage. The line current follows the line voltage closely.

(b) PSPICE Simulation of the Boost PFC Converter

Among all the controllers in Table 2, the leading-edge switch-current controlled boost converter can be implemented in an especially simple control circuit. The performance of this circuit is therefore of special interest. The circuit shown in FIG. 17 can be obtained from Table 2. Note that the diode current is sensed for the current feedback.

Figure 18:
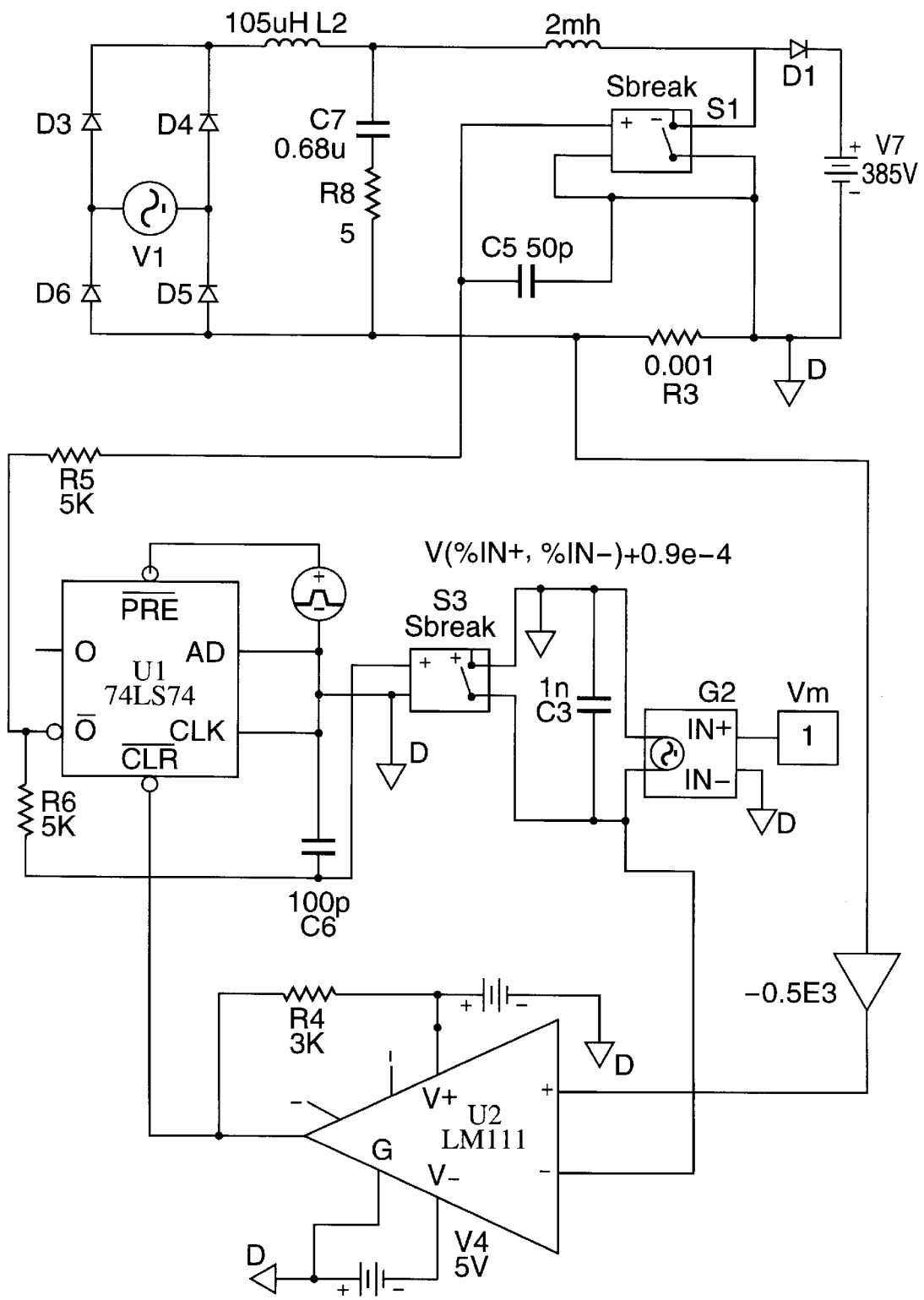
FIG. 18 is a diagram depicting a PSPICE simulated circuit design implementing a boost converter with power factor control in accordance with the present invention.
Figure 19:
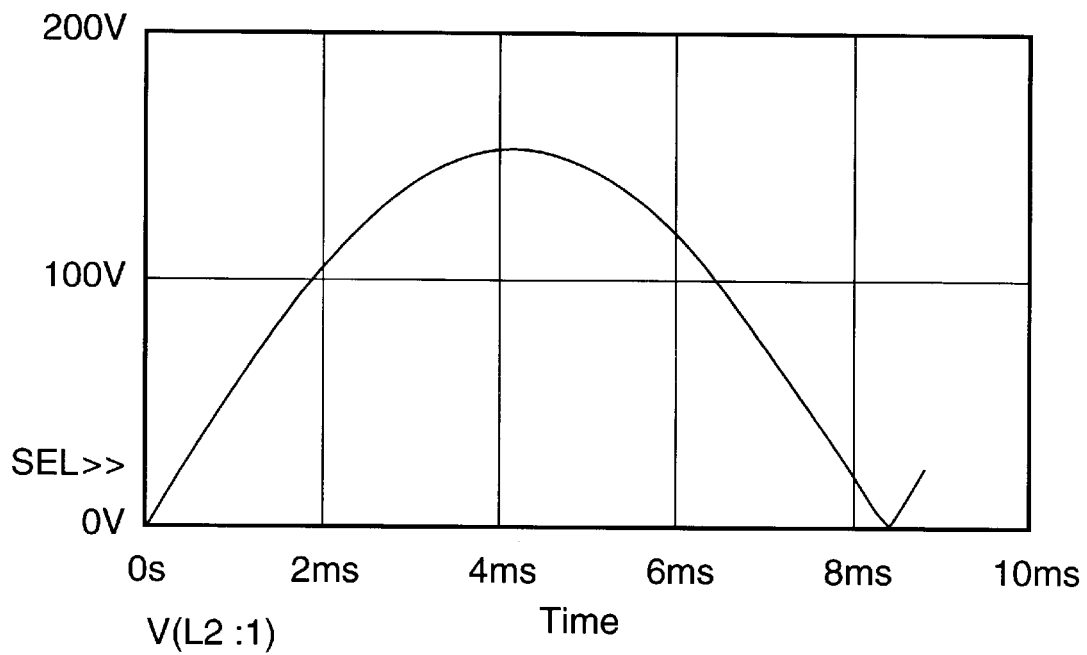
FIG. 19(a) and 19(b) are plots is a plot of PSPICE simulation-predicted line voltage for the boost converter power factor control of FIG. 18.
Figure 19:
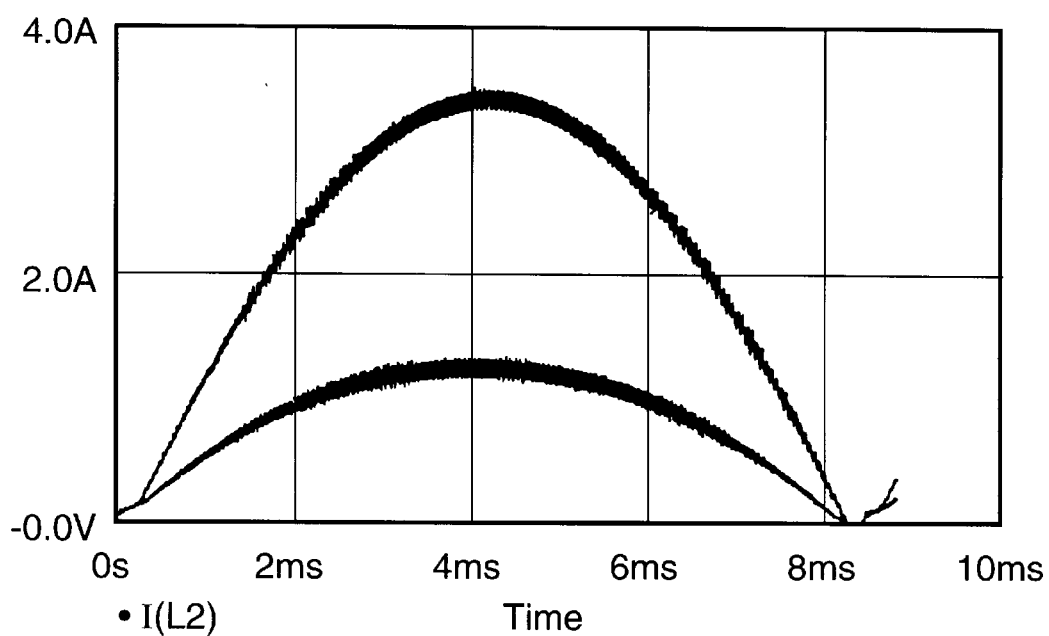

The open-loop simulation circuit is shown FIG. 18, in which a voltage-controlled current-source, a capacitor, and a voltage-controlled switch comprise an integrator-with-reset. The simulation software is PSPICE software simulation version 6.2 was used to evaluate this circuit. Circuit parameters are given in the schematic shown in FIG. 18. The switching frequency is selected to be 60 KHz. This circuit can work under wide line-voltage range, thus the output voltage is chosen to be 385 Vdc. FIG. 19(a) and 19(b) show the simulation results at 115 Vrms ac input voltage for two different load levels, i.e. two different modulation reference $v_m$ (=2 V and 0.5 V respectively).

FIG. 19(a) shows the line voltage, and FIG. 19(a) shows the line current when $v_m$=2 V and 0.5 V, respectively. Notice that even though the control circuit is extremely simple, yet the line current waveforms are still close to the line voltage waveform.

(c) Experimental results of the boost converter

An experimental circuit has been built according to FIG. 22(e) and tested. The line voltage is 110 Vrms and the output voltage is 220 Vdc. The switching frequency $f_s$ is 100 KHz. The inductance of the boost converter is 520 $\mu$H. An LC EMI filter was inserted between the diode bridge and the boost converter with an inductance of 44 $\mu$H and a capacitance of 0.68 $\mu$F. The feedback compensator $A_v(s)$ has a proportional-integral (PI) transfer function. Experimental waveforms for a full load of 350 W, 40% of full load, and 10% of the full load are shown in FIG. 24(a), FIG. 24(b) and FIG. 24(c) respectively. The waveforms in each figure, from top to bottom, are the duty ratio measured with Tektronix time-to-voltage converter TVC501, the line voltage, and the line current with its scale marked in the figure, respectively.

7. Summary

Switching converters are pulsed and nonlinear circuits. Adequate utilization of their inherent pulsed and nonlinear nature is deemed to an effective, versatile, and simple control solution. Based on this philosophy, the present invention discloses a general constant-frequency modulator that can be applied to many control methods, such as feed-forward control, current-mode control with linear or non-linear compensating-slope, continuous or discontinuous conduction mode power-factor-correction control, etc. This general modulator can also be applied to voltage-mode control and the one-cycle control, etc. In addition, the general modulator can perform modulation on both trailing-edge or leading-edge. A general double-edge modulator is introduced based on the leading and trailing-edge modulators.

The modulation equations for constant switching frequency converters are usually rational functions of duty-ratio d. Hence, they can be rearranged into the general-form by the way described in this disclosure, allowing general modulator of the present invention to be applied. Since more information is utilized for the decision-making of the duty-ratio in each switching cycle, the overall performance of the converter system can be improved.

Unified feed-forward PWM control circuits based on the general modulator and a class of controllers for single-phase PFC circuits are disclosed, and input expressions to this general modulator for these control methods are tabulated. Implementation examples are provided for several control methods to illustrate the connection between the general modulator and the switching converters. Experimental or PSPICE verification of selected control methods have demonstrated the effectiveness of this general modulator. This general modulator is composed by resettable integrators, gains, and summers; therefore, is very suitable for integration.

Although the description above contains many specificities, these should not be construed as limiting the scope of the invention but as merely providing illustrations of some of the presently preferred embodiments of this invention. Thus the scope of this invention should be determined by the appended claims and their legal equivalents.

TABLE 1

Control-inputs for the feed-forward PWM controllers of the switching converters

| | | Trailing-edge modulation | | | Leading-edge modulation | | |
|---|---|---|---|---|---|---|---|
| Converter | M(D) | $v_1$ | $v_2$ | $v_3$ | $v_1$ | $v_2$ | $v_3$ |
| buck | D | $v_m$ | $v_g/A$ | 0 | $v_g/A - v_m$ | $v_g/A$ | 0 |
| boost | $1/(1-D)$ | $v_m - v_g/A$ | $v_m$ | 0 | $v_g/A$ | $v_m$ | 0 |
| buck-boost | $D/(1-D)$ | $v_m$ | $v_g/A + v_m$ | 0 | $v_g/A$ | $v_g/A + v_m$ | 0 |
| Watkins-Johnson | $(2D-1)/D$ | $v_g/A$ | $2v_g/A - v_m$ | 0 | $v_g/A - v_m$ | $2v_g/A - v_m$ | 0 |
| bridge | $(2D-1)$ | $v_g/A + v_m$ | $2v_g/A$ | 0 | $v_g/A - v_m$ | $2v_g/A$ | 0 |
| A-quadratic | $D^2$ | $v_m$ | $v_m$ | $v_g/A$ | $v_g/A$ | $2v_g/A$ | $-v_g/A$ |
| B-quadratic | $D^2/(1-D)$ | $v_m$ | $v_m$ | $v_g/A$ | $v_g/A$ | $2v_g/A + v_m$ | $-v_g/A$ |
| C-quadratic | $D^2/(1-D)^2$ | $v_m$ | $2v_m$ | $v_g/A - v_m$ | $v_g/A$ | $2v_g/A$ | $v_m - v_g/A$ |

TABLE 2

Inputs to the general PWM modulator for proposed PFC controllers.

| Converter | | Buck-Boost | Boost | Cuk, Sepic, Zeta |
|---|---|---|---|---|
| | M(d) | $d/(1-d)$ | $1/(1-d)$ | $d/(1-d)$ |
| | N(d) | 1 | 1 | $1/d$ |
| Trailing-edge Modulation | | | | |
| $i_L$ ctrl | $v_1$ | $v_m$ | $v_m - R_s i_L$ | $v_m$ |
| | $v_2$ | $v_m$ | $v_m$ | $v_m + R_s i_L$ |
| | $v_3$ | $R_s i_L$ | 0 | 0 |
| $i_T$ ctrl | $v_1$ | $v_m$ | $v_m - R_s i_T$ | $v_m$ |
| | $v_2$ | $v_m$ | $v_m$ | $v_m$ |
| | $v_3$ | $R_s i_T$ | 0 | $R_s i_T$ |
| $<i_T>$ ctrl | $v_1$ | $v_m$ | $R_s <i_T>$ | $v_m$ |
| | $v_2$ | $v_m + R_s <i_T>$ | $v_m$ | $v_m + R_s <i_T>$ |
| | $v_3$ | 0 | $-v_m$ | 0 |
| Leading-edge Modulation | | | | |
| $i_L$ ctrl | $v_1$ | $R_s i_L$ | $R_s i_L$ | $R_s i_L$ |
| | $v_2$ | $v_m + 2R_s i_L$ | $v_m$ | $v_m R_s i_L$ |
| | $v_3$ | $-R_s i_L$ | 0 | 0 |
| $i_D$ ctrl | $v_1$ | $R_s i_D$ | $R_s i_D$ | $R_s i_D$ |
| | $v_2$ | $v_m + 2R_s i_D$ | $v_m$ | $v_m$ |
| | $v_3$ | $-R_s i_D$ | 0 | $R_s i_D$ |
| $<i_D>$ ctrl | $v_1$ | $R_s <i_D>$ | $R_2 <i_D>$ | $R_2 <i_D>$ |
| | $v_2$ | $2R_s <i_D>$ | 0 | 0 |
| | $v_3$ | $v_m - R_s <i_D>$ | $v_m$ | $v_m + R_s <i_D>$ |

What is claimed is:

1. A pulse-width modulator, comprising:

(a) a plurality N of series-connected resettable integrator means for integrating input signals and producing integrated output signals where N>2, each said integrator means having an input and an output;

(b) at least N–1 summers, each said summer connected between the input of an integrator means and the output of the immediately preceding integrator means in said series of integrator means, each said summer having an integrated signal input, an external signal input, and an output;

(c) at least N–1 gain stages, each said gain stage connected between the integrated signal input of a summer and the output of the immediately preceding integrator means;

(d) comparator means, having an input connected to the output of a first of said integrator means, for comparing the integrated output signal from said first of said integrator means with a reference signal and producing an output signal responsive to said integrated output signal being approximately equal to said reference signal;

(e) clock means for producing clock pulses; and (f) switching means, responsive to said clock pulses and said output signal from said comparator means, for producing pulse-width modulated output pulses and for switching said each of said integrator means between an integrating state and a reset state.

2. A pulse-width modulator as recited in claim 1, wherein each said gain stage has a gain n where n is an integer representing the integrator means n in the series n=2, . . . , N and where integrator means n=1 is the integrator means connected to said comparator.

3. A pulse-width modulator as recited in claim 1, wherein each said integrator means operates in an integrating state when said clock pulses are applied to said switching means and said integrated output signal received by said comparator means is less than said reference signal, and wherein each said integrator means is reset when said output signal from said comparator means is applied to said switching means.

4. A pulse-width modulator as recited in claim 1, wherein said switching means comprises a flip-flop, said flip-flop having a first input connected to said clock means, said flip-flop having a second input connected to an output of said comparator means, said flip-flop having a first output connected to a reset line on each said integrator means, said flip-flop including a second output for providing said pulse-width modulated output pulses.

5. A pulse-width modulator as recited in claim 4, wherein said flip-flop comprises a set-reset flip flop having a set input, a reset input, a Q output and an $\overline{Q}$ output, said set input connected to said clock means, said reset input connected to an output of said comparator means, said $\overline{Q}$ output connected to said reset lines on said integrator means, and said Q output providing said pulse-width modulated output pulses.

6. A pulse-width modulator, comprising:

(a) a plurality N of series-connected integrators where N>2, each said integrator having an input, an output and a reset line;

(b) at least N–1 summers, each said summer connected between the input of an integrator and the output of the immediately preceding integrator in said series of integrators, each said summer having an integrated signal input, an external signal input, and an output;

(c) at least N–1 gain stages, each said gain stage connected between the integrated signal input of a summer and the output of the immediately preceding integrator;

(d) a comparator, said comparator having a first input, a second input, and an output, said first input of said comparator connected to the output of a first of said integrators;

(e) a constant frequency clock, and (f) a flip-flop, said flip-flop having a first input connected to said clock, said flip-flop having a second input connected to said output of said comparator, said flip-flop having a first output connected to said reset lines of said integrators, said flip-flop including a second output for providing said pulse-width modulated output pulses.

7. A pulse-width modulator as recited in claim 6, wherein each said gain stage has a gain n where n is an integer representing the integrator n in the series n=2, . . . , N and where integrator n=1 is the integrator connected to said comparator.

8. A pulse-width modulator as recited in claim 6, wherein said comparator compares an output signal from said first integrator with a reference signal applied to said second input of said comparator and produces an output signal responsive to said output signal from said first integrator being approximately equal to said reference signal.

9. A pulse-width modulator as recited in claim 8, wherein each said integrator operates in an integrating state in response to pulses from said clock and said output signal from said first integrator being less than said reference signal, and wherein each said integrator is reset in response to said output signal from said comparator.

10. A pulse-width modulator as recited in claim 6, wherein said flip-flop comprises a set-reset flip flop having a set input, a reset input, a Q output and an $\overline{Q}$ output, said set input connected to said clock, said reset input connected to said output of said comparator, said $\overline{Q}$ output connected to said reset lines on said integrators, and said Q output providing said pulse-width modulated output pulses.

11. A pulse-width modulator, comprising:

(a) resettable integrator means for integrating an input signal $v_2$ and producing an integrated output signal;

(b) comparator means for comparing said integrated output signal with a reference signal $v_i$ and producing an output signal responsive to said integrated output signal being approximately equal to said reference signal;

(c) clock means for producing clock pulses; and (d) switching means, responsive to said clock pulses and said output signal from said comparator means, for producing pulse-width modulated output pulses and for switching said integrator means between an integrating state and a reset state;

(e) wherein $v_1$ and $v_2$ are selected from the group of signals consisting of

| | Converter | Buck-Boost | Boost | Cuk, Sepic, Zeta |
|---|---|---|---|---|
| Trailing-edge Modulation | M(d) N(d) | d/(1-d) 1 | 1/(1-d) 1 | d/(1-d) 1/d |
| $i_L$ ctrl | $v_1$ $v_2$ $v_3$ | | $v_m - R_s i_L$ $v_m$ | $v_m$ $v_m + R_s i_L$ |
| $i_T$ ctrl | $v_1$ $v_2$ $v_3$ | | $v_m - R_s i_T$ $v_m$ | |
| $\langle i_T \rangle$ ctrl | $v_1$ $v_2$ $v_3$ | $v_m$ $v_m + R_s \langle i_T \rangle$ | | $v_m$ $v_m + R_s \langle i_T \rangle$ |

| | Converter | Buck-Boost | Boost | Cuk, Sepic, Zeta |
|---|---|---|---|---|
| Leading-edge Modulation | | | | |
| $i_L$ ctrl | | $v_1$ | $R_s i_L$ | $R_s i_L$ |
| | | $v_2$ | $v_m$ | $v_m + R_s i_L$ |
| | | $v_3$ | | |
| $i_D$ ctrl | | $v_1$ | $R_s i_D$ | |
| | | $v_2$ | $v_m$ | |
| | | $v_3$ | | |
| $<i_D>$ ctrl | | $v_1$ | | |
| | | $v_2$ | | |
| | | $v_3$ | | | where $R_s$=equivalent current sensing resistance, $i_T$=instant switch current, $i_L$=instant inductor current, $i_D$=instant diode current, $v_m$=modulation reference voltage, d=duty ratio, and ctrl is an abbreviation for control.

12. A pulse-width modulator as recited in claim 11, wherein said integrator means operates in an integrating state when said clock pulses are applied to said switching means and said integrated output signal is less than said reference signal, and wherein said integrator means is reset when said output signal from said comparator means is applied to said switching means.

13. A pulse-width modulator as recited in claim 11, wherein said switching means comprises a flip-flop, said flip-flop having a first input connected to said clock means, said flip-flop having a second input connected to an output of said comparator means, said flip-flop having a first output connected to a reset line on said integrator means, said flip-flop including a second output for providing said pulse-width modulated output pulses.

14. A pulse-width modulator as recited in claim 13, wherein said flip-flop comprises a set-reset flip flop having a set input, a reset input, a Q output and an $\overline{Q}$ output, said set input connected to said clock means, said reset input connected to an output of said comparator means, said $\overline{Q}$ output connected to said reset line on said integrator means, and said Q output providing said pulse-width modulated output pulses.

15. A pulse-width modulator, comprising:

(a) an integrator, said integrator having an input for receiving an input signal $v_2$, an output and a reset line;

(b) a comparator, said comparator having a first input, a second input for receiving a reference signal $v_1$, and an output, said first input of said comparator connected to said output of said integrator;

(c) a constant frequency clock; and (d) a flip-flop, said flip-flop having a first input connected to said clock, said flip-flop having a second input connected to said output of said comparator, said flip-flop having a first output connected to said reset line of said integrator, said flip-flop including a second output for providing said pulse-width modulated output pulses;

(e) wherein $v_1$ and $v_2$ are selected from the group of signals consisting of

| | Converter | Buck-Boost | Boost | Cuk, Sepic, Zeta |
|---|---|---|---|---|
| M(d) | | d/(1-d) | 1/(1-d) | d/(1-d) |
| N(d) | | 1 | 1 | 1/d |
| Trailing-edge Modulation | | | | |
| $i_L$ ctrl | $v_1$ | | $v_m - R_s i_L$ | $v_m$ |
| | $v_2$ | | $v_m$ | $v_m + R_s i_L$ |
| | $v_3$ | | | |
| $i_T$ ctrl | $v_1$ | | $v_m - R_s i_T$ | $v_m$ |
| | $v_2$ | | $v_m$ | |
| | $v_3$ | | | |
| $<i_T>$ ctrl | $v_1$ | | $v_m$ | $v_m$ |
| | $v_2$ | | $v_m + R_s<i_T>$ | $v_m + R_s<i_T>$ |
| | $v_3$ | | | |
| Leading-edge Modulation | | | | |
| $i_L$ ctrl | $v_1$ | | $R_s i_L$ | $R_s i_L$ |
| | $v_2$ | | $v_m$ | $v_m + R_s i_L$ |
| | $v_3$ | | | |
| $i_D$ ctrl | $v_1$ | | $R_s i_D$ | |
| | $v_2$ | | $v_m$ | |
| | $v_3$ | | | |
| $<i_D>$ ctrl | $v_1$ | | | |
| | $v_2$ | | | |
| | $v_3$ | | | | where $R_s$ equivalent current sensing resistance, $i_T$=instant switch current, $i_L$=instant inductor current, $i_D$=instant diode current, $v_m$=modulation reference voltage, d=duty ratio, and ctrl is an abbreviation for control.

16. A pulse-width modulator as recited in claim 15, wherein said comparator compares an output signal from said integrator with a reference signal applied to said second input of said comparator and produces an output signal responsive to said output signal from said integrator being approximately equal to said reference signal.

17. A pulse-width modulator as recited in claim 16, wherein said integrator operates in an integrating state in response to pulses from said clock and said output signal from said integrator being less than said reference signal, and wherein said integrator is reset in response to said output signal from said comparator.

18. A pulse-width modulator as recited in claim 15, wherein said flip-flop comprises a set-reset flip flop having a set input, a reset input, a Q output and an $\overline{Q}$ output, said set input connected to said clock, said reset input connected to said output of said comparator, said $\overline{Q}$ output connected to said reset line on said integrator, and said Q output providing said pulse-width modulated output pulses.

19. A pulse-width modulator, comprising:

(a) first resettable integrator means for integrating a first input signal and producing a first output signal, said first integrator means having an input and an output;

(b) comparator means, having an input connected to said output of said first integrator means, for comparing said first output signal with a reference signal and producing a second output signal responsive to said first output signal being approximately equal to said reference signal;

(c) clock means for producing clock pulses;

(d) second resettable integrator means for integrating a second input signal and producing a third output signal, said second integrator means having an output connected to an input of a gain stage, said gain stage having an output connected to summer means for summing said third output signal and a third input signal, said summer having an output connected to said input of said first integrator means; and (e) switching means, responsive to said clock pulses and said output signal from said comparator means, for producing pulse-width modulated output pulses and for switching said first integrator means and said second integrator means between an integrating state and a reset state.

20. A pulse-width modulator as recited in claim 19, wherein said gain stage has a gain of two.

21. A pulse-width modulator as recited in claim 19, wherein said reference signal is designated $v_1$, said third input signal is designated $v_2$, said second input signal is designated $V_3$, and $v_1$, $v_2$ and $v_3$ are selected from the group of signals consisting of

| | Converter | Buck-Boost | Boost | Cuk, Sepic, Zeta |
|---|---|---|---|---|
| | M(d) | d/(1-d) | 1/(1-d) | d/(1-d) |
| | N(d) | 1 | 1 | 1/d |
| Trailing-edge Modulation | | | | |
| $i_L$ ctrl | $v_1$ | $v_m$ | | |
| | $v_2$ | $v_m$ | | |
| | $v_3$ | $R_s i_L$ | | |
| $i_T$ ctrl | $v_1$ | $v_m$ | | $v_m$ |
| | $v_2$ | $v_m$ | | $v_m$ |
| | $v_3$ | $R_s i_T$ | | $R_s i_T$ |
| $<i_T>$ ctrl | $v_1$ | | $R_s<i_T>$ | |
| | $v_2$ | | $v_m$ | |
| | $v_3$ | | $-v_m$ | |
| Leading-edge Modulation | | | | |
| $i_L$ ctrl | $v_1$ | $R_s i_L$ | | |
| | $v_2$ | $v_m + 2R_s i_L$ | | |
| | $v_3$ | $-R_2 i_L$ | | |
| $i_D$ ctrl | $v_1$ | $R_s i_D$ | | $R_s i_D$ |
| | $v_2$ | $v_m + 2R_s i_D$ | | $v_m$ |
| | $v_3$ | $-R_s i_D$ | | $R_s i_D$ |
| $<i_D>$ ctrl | $v_1$ | $R_s<i_D>$ | $R_s<i_D>$ | $R_s<i_D>$ |
| | $v_2$ | $2R_s<i_D>$ | 0 | 0 |
| | $v_3$ | $v_m - R_s<i_D>$ | $v_m$ | $v_m + R_s<i_D>$ | where $R_s$=equivalent current sensing resistance, $i_T$=instant switch current, $i_L$=instant inductor current, $i_D$=instant diode current, $v_m$=modulation reference voltage, d=duty ratio, and ctrl is an abbreviation for control.

22. A pulse-width modulator as recited in claim 19, wherein said first integrator means and said second integrator means operate in an integrating state when said clock pulses are applied to said switching means and said first integrated output signal is less than said reference signal, and wherein said first integrator means and said second integrator means are reset when said output signal from said comparator means is applied to said switching means.

23. A pulse-width modulator as recited in claim 19, wherein said switching means comprises a flip-flop, said flip-flop having a first input connected to said clock means, said flip-flop having a second input connected to an output of said comparator means, said flip-flop having a first output connected to a reset line on said first integrator means and to a reset line on said second integrator means, said flip-flop including a second output for providing said pulse-width modulated output pulses.

24. A pulse-width modulator as recited in claim 23, wherein said flip-flop comprises a set-reset flip flop having a set input, a reset input, a Q output and an $\overline{Q}$ output, said set input connected to said clock means, said reset input connected to an output of said comparator means, said $\overline{Q}$ output connected to said reset lines on said first and second integrator means, and said Q output providing said pulse-width modulated output pulses.

25. A pulse-width modulator, comprising:

(a) a first integrator, said first integrator having an input, an output and a reset line;

(b) a comparator, said comparator having a first input, a second input for receiving a reference signal, and an output, said first input of said comparator connected to said output of said first integrator;

(c) a second integrator, said second integrator, second integrator having an input for receiving a first input signal, an output and a reset line, said output of said second integrator connected to an input of a gain stage, said gain stage having an output connected to a first input of a summer, said summer having an output connected to said input of said first integrator, said summer having an external signal input for receiving a second input signal;

(d) a constant frequency clock, and (e) a flip-flop, said flip-flop having a first input connected to said clock, said flip-flop having a second input connected to said output of said comparator, said flip-flop having a first output connected to said reset lines of said integrators, said flip-flop including a second output for providing said pulse-width modulated output pulses.

26. A pulse-width modulator as recited in claim 25, wherein said gain stage has a gain of two.

27. A pulse-width modulator as recited in claim 25, wherein said first input signal is designated $v_3$, said second input signal is designated $v_2$, said reference signal is designated $v_1$, and $v_1$, $v_2$ and $v_3$ are selected from the group of signals consisting of

| | Converter | Buck-Boost | Boost | Cuk, Sepic, Zeta |
|---|---|---|---|---|
| | M(d) | d/(1-d) | 1/(1-d) | d/(1-d) |
| | N(d) | 1 | 1 | 1/d |
| Trailing-edge Modulation | | | | |
| $i_L$ ctrl | $v_1$ | $v_m$ | | |
| | $v_2$ | $v_m$ | | |
| | $v_3$ | $R_s i_L$ | | |
| $i_T$ ctrl | $v_1$ | $v_m$ | | $v_m$ |
| | $v_2$ | $v_m$ | | $v_m$ |
| | $v_3$ | $R_s i_T$ | | $R_s i_T$ |
| $<i_T>$ ctrl | $v_1$ | | $R_s<i_T>$ | |
| | $v_2$ | | $v_m$ | |
| | $v_3$ | | $-v_m$ | |
| Leading-edge Modulation | | | | |
| $i_L$ ctrl | $v_1$ | $R_s i_L$ | | |
| | $v_2$ | $v_m + 2R_s i_L$ | | |
| | $v_3$ | $-R_2 i_L$ | | |
| $i_D$ ctrl | $v_1$ | $R_s i_D$ | | $R_s i_D$ |
| | $v_2$ | $v_m + 2R_s i_D$ | | $v_m$ |
| | $v_3$ | $-R_s i_D$ | | $R_s i_D$ |
| $<i_D>$ ctrl | $v_1$ | $R_s<i_D>$ | $R_s<i_D>$ | $R_s<i_D>$ |
| | $v_2$ | $2R_s<i_D>$ | 0 | 0 |
| | $v_3$ | $v_m - R_s<i_D>$ | $v_m$ | $v_m + R_s<i_D>$ | where $R_4$=equivalent current sensing resistance, $i_T$=instant switch current, $i_L$=instant inductor current, $i_D$=instant diode current, $v_m$=modulation reference voltage, d=duty ratio, and ctrl is an abbreviation for control.

28. A pulse-width modulator as recited in claim 25, wherein said comparator compares an output signal from said integrator with a reference signal applied to said second input of said comparator and produces an output signal responsive to said output signal from said integrator being approximately equal to said reference signal.

29. A pulse-width modulator as recited in claim 28, wherein said each said integrator operates in an integrating state in response to pulses from said clock and said output signal from said first integrator being less than said reference signal, and wherein each said integrator is reset in response to said output signal from said comparator.

30. A pulse-width modulator as recited in claim 25, wherein said flip-flop comprises a set-reset flip flop having a set input, a reset input, a Q output and an $\overline{Q}$ output, said set input connected to said clock, said reset input connected to said output of said comparator, said $\overline{Q}$ output connected to said reset lines on said integrators, and said Q output providing said pulse-width modulated output pulses.

* * * * *